(12) United States Patent
Ando

(10) Patent No.: US 11,374,379 B2
(45) Date of Patent: Jun. 28, 2022

(54) LASER SYSTEM, EXTREME ULTRAVIOLET LIGHT GENERATION APPARATUS, AND EXTREME ULTRAVIOLET LIGHT GENERATION METHOD

(71) Applicant: Gigaphoton Inc., Tochigi (JP)

(72) Inventor: Masahiko Ando, Tochigi (JP)

(73) Assignee: Gigaphoton Inc., Tochigi (JP)

( * ) Notice: Subject to any disclaimer, the term of this patent is extended or adjusted under 35 U.S.C. 154(b) by 292 days.

(21) Appl. No.: 16/711,690

(22) Filed: Dec. 12, 2019

(65) Prior Publication Data

US 2020/0119514 A1 Apr. 16, 2020

Related U.S. Application Data

(63) Continuation of application No. PCT/JP2017/024760, filed on Jul. 6, 2017.

(51) Int. Cl.
*H01S 3/11* (2006.01)
*H01S 3/10* (2006.01)
(Continued)

(52) U.S. Cl.
CPC ............ *H01S 3/11* (2013.01); *G02B 27/1006* (2013.01); *G03F 7/70033* (2013.01);
(Continued)

(58) Field of Classification Search
CPC ........ H01S 2/0071; H01S 3/11; H01S 3/0085; H01S 3/08059; H01S 3/10046;
(Continued)

(56) References Cited

U.S. PATENT DOCUMENTS

| | | | |
|---|---|---|---|
| 9,596,743 B2* | 3/2017 | Enzmann | H05G 2/005 |
| 2008/0149862 A1* | 6/2008 | Hansson | H05G 2/005 |
| | | | 250/504 R |

(Continued)

FOREIGN PATENT DOCUMENTS

| | | |
|---|---|---|
| JP | 2008146082 A | 6/2008 |
| JP | 2009110635 A | 5/2009 |

(Continued)

OTHER PUBLICATIONS

International Search Report issued in PCT/JP2017/024760; dated Sep. 26, 2017.

(Continued)

*Primary Examiner* — Wyatt A Stoffa
(74) *Attorney, Agent, or Firm* — Studebaker & Brackett PC

(57) ABSTRACT

A laser system includes: a pulse laser system configured to emit a first laser beam having a first wavelength component and having a first polarization component and a second laser beam having the first wavelength component and having a second polarization component; a guide laser apparatus configured to emit a third laser beam having a second wavelength component; a polarization conversion mechanism configured to be able to switch between a first state in which the third laser beam is emitted as a first guide laser beam having the first polarization component, and a second state in which the third laser beam is emitted as a second guide laser beam having the second polarization component; a dichroic mirror configured to reflect the first and second laser beams having the first wavelength component or the first and second guide laser beams having the second wavelength component, to transmit the first and second laser beams or the first and second guide laser beams that are not reflected by the dichroic mirror; and a polarization beam splitter configured to reflect the first laser beam and the first (Continued)

guide laser beam, and to transmit the second laser beam and the second guide laser beam.

18 Claims, 10 Drawing Sheets

(51) Int. Cl.
    *G02B 27/10*     (2006.01)
    *G03F 7/20*     (2006.01)
    *H05G 2/00*     (2006.01)
    *H01S 3/08*     (2006.01)
    *H01S 3/00*     (2006.01)
    *H01S 3/23*     (2006.01)
    *G02B 27/09*     (2006.01)
    *G02B 26/08*     (2006.01)
    *G02B 27/28*     (2006.01)

(52) U.S. Cl.
    CPC ......... *H01S 3/10046* (2013.01); *H05G 2/008* (2013.01); *G02B 26/0816* (2013.01); *G02B 26/0875* (2013.01); *G02B 27/0961* (2013.01); *G02B 27/281* (2013.01); *G02B 27/285* (2013.01); *G02B 27/286* (2013.01); *H01S 3/0071* (2013.01); *H01S 3/08059* (2013.01); *H01S 3/10061* (2013.01); *H01S 3/2391* (2013.01)

(58) Field of Classification Search
    CPC ... H01S 3/10061; H01S 3/2391; H05G 2/008; G02B 26/0816; G02B 26/0875; G02B 27/0961; G02B 27/1006; G02B 27/281; G02B 27/285; G02B 27/286
See application file for complete search history.

(56) References Cited

U.S. PATENT DOCUMENTS

| | | | |
|---|---|---|---|
| 2010/0117009 A1 | 5/2010 | Moriya et al. | |
| 2011/0141865 A1 | 6/2011 | Senekerimyan et al. | |
| 2013/0119232 A1 | 5/2013 | Moriya et al. | |
| 2015/0083898 A1 | 3/2015 | Senekerimyan et al. | |
| 2015/0083936 A1 | 3/2015 | Wehrens | |
| 2016/0073487 A1* | 3/2016 | Yanagida | H05G 2/006 250/504 R |
| 2017/0150591 A1* | 5/2017 | Ando | H05G 2/008 |

FOREIGN PATENT DOCUMENTS

| | | |
|---|---|---|
| JP | 2010135769 A | 6/2010 |
| JP | 2013513929 A | 4/2013 |
| JP | 2013105725 A | 5/2013 |
| JP | 2016538703 A | 12/2016 |
| WO | 2016038657 A1 | 3/2016 |

OTHER PUBLICATIONS

International Preliminary Report On Patentability and Written Opinion issued in PCT/JP2017/024760; dated Jan. 7, 2020.

* cited by examiner

LASER SYSTEM, EXTREME ULTRAVIOLET LIGHT GENERATION APPARATUS, AND EXTREME ULTRAVIOLET LIGHT GENERATION METHOD

CROSS-REFERENCE TO RELATED APPLICATIONS

The present application is a continuation application of International Application No. PCT/JP2017/024760 filed on Jul. 6, 2017. The content of the application is incorporated herein by reference in its entirety.

BACKGROUND

1. Technical Field

The present disclosure relates to a laser system, an extreme ultraviolet light generation apparatus, and an extreme ultraviolet light generation method.

2. Related Art

Recently, miniaturization of semiconductor processes has involved rapidly increasing miniaturization of transfer patterns for use in photolithography of the semiconductor processes. In the next generation, microfabrication at 70 nm to 45 nm and further microfabrication at 32 nm or less will be required. Thus, to satisfy the requirement for the microfabrication, for example, at 32 nm or less, development of an exposure apparatus is expected including a combination of an extreme ultraviolet light generation apparatus configured to generate extreme ultraviolet (EUV) light having a wavelength of about 13 nm and reduced projection reflection optics.

Three types of EUV light generation apparatuses have been proposed: an LPP (Laser Produced Plasma) type apparatus using plasma generated by irradiating a target substance with a pulse laser beam, a DPP (Discharge Produced Plasma) type apparatus using plasma generated by discharge, and an SR (Synchrotron Radiation) type apparatus using synchrotron radiation.

LIST OF DOCUMENTS

Patent Documents

Patent Document 1: Japanese Unexamined Patent Application Publication No. 2009-110635
Patent Document 2: International Patent Publication No. 2016/038657

SUMMARY

A laser system according to an aspect of the present disclosure includes: a pulse laser system configured to emit, along a first optical path, a first laser beam having a first wavelength component and having a first polarization component and a second laser beam having the first wavelength component and having a second polarization component different from the first polarization component; a guide laser apparatus configured to emit, along a second optical path, a third laser beam having a second wavelength component different from the first wavelength component; a polarization conversion mechanism located in the second optical path, and configured to be able to switch between a first state in which the third laser beam is emitted as a first guide laser beam having the first polarization component along a third optical path, and a second state in which the third laser beam is emitted as a second guide laser beam having the second polarization component along the third optical path; a dichroic mirror having a first surface located in the first optical path and a second surface located in the third optical path, and configured to reflect the first and second laser beams having the first wavelength component or the first and second guide laser beams having the second wavelength component, to transmit the first and second laser beams or the first and second guide laser beams that are not reflected by the dichroic mirror, and to emit the first and second laser beams and the first and second guide laser beams along a fourth optical path; and a polarization beam splitter located in the fourth optical path, and configured to reflect the first laser beam having the first wavelength component and having the first polarization component and the first guide laser beam having the second wavelength component and having the first polarization component, and to transmit and emit the second laser beam having the first wavelength component and having the second polarization component and the second guide laser beam having the second wavelength component and having the second polarization component.

An extreme ultraviolet light generation apparatus according to an aspect of the present disclosure includes: a laser system including a pulse laser system configured to emit, along a first optical path, a first laser beam having a first wavelength component and having a first polarization component and a second laser beam having the first wavelength component and having a second polarization component different from the first polarization component, a guide laser apparatus configured to emit, along a second optical path, a third laser beam having a second wavelength component different from the first wavelength component, a polarization conversion mechanism located in the second optical path, and configured to be able to switch between a first state in which the third laser beam is emitted as a first guide laser beam having the first polarization component along a third optical path, and a second state in which the third laser beam is emitted as a second guide laser beam having the second polarization component along the third optical path, a dichroic mirror having a first surface located in the first optical path and a second surface located in the third optical path, and configured to reflect the first and second laser beams having the first wavelength component or the first and second guide laser beams having the second wavelength component, to transmit the first and second laser beams or the first and second guide laser beams that are not reflected by the dichroic mirror, and to emit the first and second laser beams and the first and second guide laser beams along a fourth optical path, and a polarization beam splitter located in the fourth optical path, and configured to reflect the first laser beam having the first wavelength component and having the first polarization component and the first guide laser beam having the second wavelength component and having the first polarization component, and to transmit and emit the second laser beam having the first wavelength component and having the second polarization component and the second guide laser beam having the second wavelength component and having the second polarization component; a chamber; a target supply unit configured to supply a target to a predetermined region in the chamber; and a laser beam collecting optical system configured to focus the first and second laser beams emitted from the laser system on the predetermined region.

An extreme ultraviolet light generation method according to an aspect of the present disclosure uses an extreme ultraviolet light generation apparatus including a laser system including a pulse laser system configured to emit, along a first optical path, a first laser beam having a first wavelength component and having a first polarization component and a second laser beam having the first wavelength component and having a second polarization component different from the first polarization component, a guide laser apparatus configured to emit, along a second optical path, a third laser beam having a second wavelength component different from the first wavelength component, a polarization conversion mechanism located in the second optical path, and configured to be able to switch between a first state in which the third laser beam is emitted as a first guide laser beam having the first polarization component along a third optical path, and a second state in which the third laser beam is emitted as a second guide laser beam having the second polarization component along the third optical path, a dichroic mirror having a first surface located in the first optical path and a second surface located in the third optical path, and configured to reflect the first and second laser beams having the first wavelength component or the first and second guide laser beams having the second wavelength component, to transmit the first and second laser beams or the first and second guide laser beams that are not reflected by the dichroic mirror, and to emit the first and second laser beams and the first and second guide laser beams along a fourth optical path, and a polarization beam splitter located in the fourth optical path, and configured to reflect the first laser beam and the first guide laser beam having the first polarization component or the second laser beam and the second guide laser beam having the second polarization component, and to transmit and emit the first laser beam and the first guide laser beam or the second laser beam and the second guide laser beam that are not reflected by the polarization beam splitter, a chamber, a target supply unit configured to supply a target to a predetermined region in the chamber, and a laser beam collecting optical system configured to focus the first and second laser beams emitted from the laser system on the predetermined region, and the method includes: a first step of detecting the first guide laser beam emitted from the polarization beam splitter when the polarization conversion mechanism is in the first state; and a second step of, after the first step, switching the polarization conversion mechanism to the second state and detecting the second guide laser beam emitted from the polarization beam splitter.

BRIEF DESCRIPTION OF THE DRAWINGS

With reference to the accompanying drawings, some embodiments of the present disclosure will be described below merely by way of example.

DESCRIPTION OF EMBODIMENTS

Figure 1:
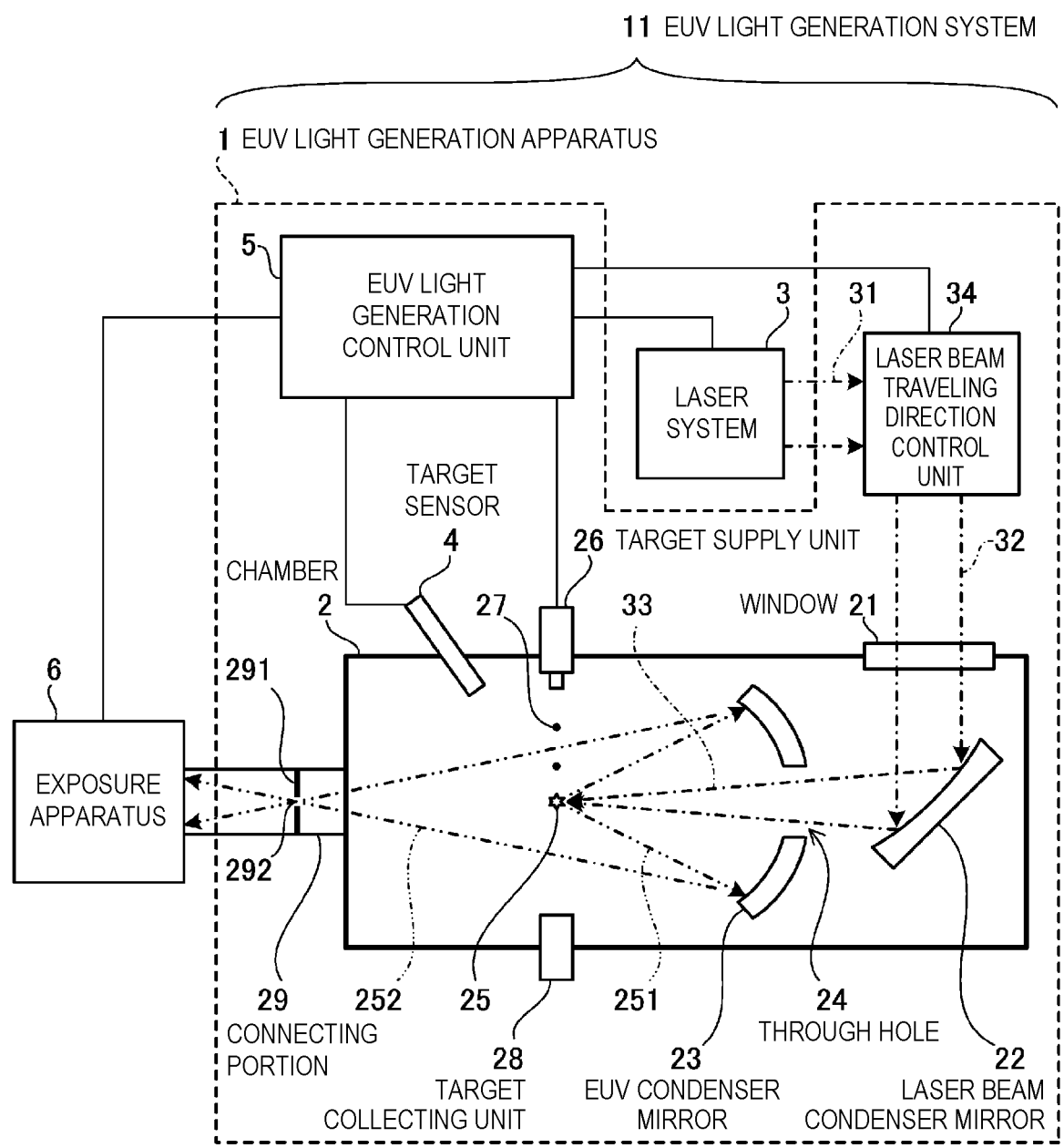
FIG. 1 schematically shows a configuration of an exemplary LPP type EUV light generation system.

<Contents>
1. General description of EUV light generation system
    1.1 Configuration
    1.2 Operation
2. EUV light generation system according to comparative example
    2.1 Configuration
        2.1.1 Laser system 3
            2.1.1.1 Optical paths of first and second pre-pulse laser beams P1, P2
            2.1.1.2 Optical path of first guide laser beam G1
            2.1.1.3 Optical path of main pulse laser beam M
        2.1.2 Laser beam traveling direction control unit 34
            2.1.2.1 Optical path tubes 330, 340
            2.1.2.2 Chamber reference member 10
        2.1.3 Mirror housing container 60
    2.2 Operation
    2.3 Problem
3. EUV light generation system including polarization conversion mechanism
    3.1 Outline
    3.2 Configuration
        3.2.1 Laser system 3
        3.2.2 Laser beam traveling direction control unit 34
    3.3 Operation
    3.4 Effect
4. Example of beam adjusting device
    4.1 Beam position and beam pointing adjuster
    4.2 Beam diameter and beam divergence adjuster
5. Example of beam monitor
6. Supplementation Now, with reference to the drawings, an embodiment of the present disclosure will be described in detail. The embodiment described below illustrates some examples of the present disclosure, and does not limit contents of the present disclosure. Also, all configurations and operations described in the embodiment are not necessarily essential as configurations and operations of the present disclosure. Like components are denoted by like reference numerals, and overlapping descriptions are omitted.

1. General Description of EUV Light Generation System 1.1 Configuration

FIG. 1 schematically shows a configuration of an exemplary LPP type EUV light generation system. An EUV light generation apparatus 1 is used together with at least one laser system 3. In this application, a system including the EUV light generation apparatus 1 and the laser system 3 is referred to as an EUV light generation system 11. As shown in FIG. 1 and described below in detail, the EUV light generation apparatus 1 includes a chamber 2 and a target supply unit 26. The chamber 2 is configured to be sealable. The target supply unit 26 is mounted, for example, to extend through a wall of the chamber 2. A material of a target substance output from the target supply unit 26 may include tin, terbium, gadolinium, lithium, xenon, or any combinations of two or more of them, but not limited to them.

The wall of the chamber 2 has at least one through-hole. A window 21 is provided in the through-hole. A pulse laser beam 32 output from the laser system 3 passes through the window 21. In the chamber 2, an EUV condenser mirror 23 having, for example, a spheroidal reflection surface is arranged. The EUV condenser mirror 23 has first and second focal points. On a surface of the EUV condenser mirror 23, a multilayer reflective film including, for example, alternately stacked molybdenum and silicon is formed. The EUV condenser mirror 23 is arranged so that, for example, the first focal point is located in a plasma generating region 25 and the second focal point is located in an intermediate focal (IF) point 292. A through-hole 24 is provided in a center of the EUV condenser mirror 23. A pulse laser beam 33 passes through the through-hole 24.

The EUV light generation apparatus 1 includes an EUV light generation control unit 5, a target sensor 4, and the like. The target sensor 4 has an imaging function, and is configured to detect presence, a trajectory, a position, a speed, or the like of a target 27.

The EUV light generation apparatus 1 includes a connecting portion 29 configured to provide communication between an interior of the chamber 2 and an interior of an exposure apparatus 6. In the connecting portion 29, a wall 291 having an aperture is provided. The wall 291 is arranged so that the aperture is located in a second focal position of the EUV condenser mirror 23.

Further, the EUV light generation apparatus 1 includes a laser beam traveling direction control unit 34, a laser beam condenser mirror 22, a target collecting unit 28 for collecting the target 27, and the like. The laser beam traveling direction control unit 34 includes an optical element for defining a traveling direction of a laser beam, and an actuator for adjusting a position, an orientation, or the like of the optical element.

1.2 Operation

With reference to FIG. 1, a pulse laser beam 31 output from the laser system 3 passes through the laser beam traveling direction control unit 34 and passes through the window 21 as the pulse laser beam 32, which enters the chamber 2. The pulse laser beam 32 travels along at least one laser beam path in the chamber 2, is reflected by the laser beam condenser mirror 22, and is applied as the pulse laser beam 33 to at least one target 27.

The target supply unit 26 outputs the target 27 toward the plasma generating region 25 in the chamber 2. The target 27 is irradiated with at least one pulse included in the pulse laser beam 33. The target 27 irradiated with the pulse laser beam is turned into plasma, and radiation light 251 is radiated from the plasma. The EUV condenser mirror 23 reflects EUV light included in the radiation light 251 with higher reflectance than light in a different wavelength range. Reflected light 252 including the EUV light reflected by the EUV condenser mirror 23 is focused on the intermediate focal point 292 and output to the exposure apparatus 6. One target 27 may be irradiated with a plurality of pulses included in the pulse laser beam 33.

The EUV light generation control unit 5 collectively controls the entire EUV light generation system 11. The EUV light generation control unit 5 processes image date or the like of the target 27 captured by the target sensor 4. Also, the EUV light generation control unit 5 controls, for example, output timing of the target 27, an output direction of the target 27, or the like. Further, the EUV light generation control unit 5 controls, for example, oscillation timing of the laser system 3, a traveling direction of the pulse laser beam 32, a focusing position of the pulse laser beam 33, or the like. These various controls are mere examples, and other controls may be added as required.

Figure 2:
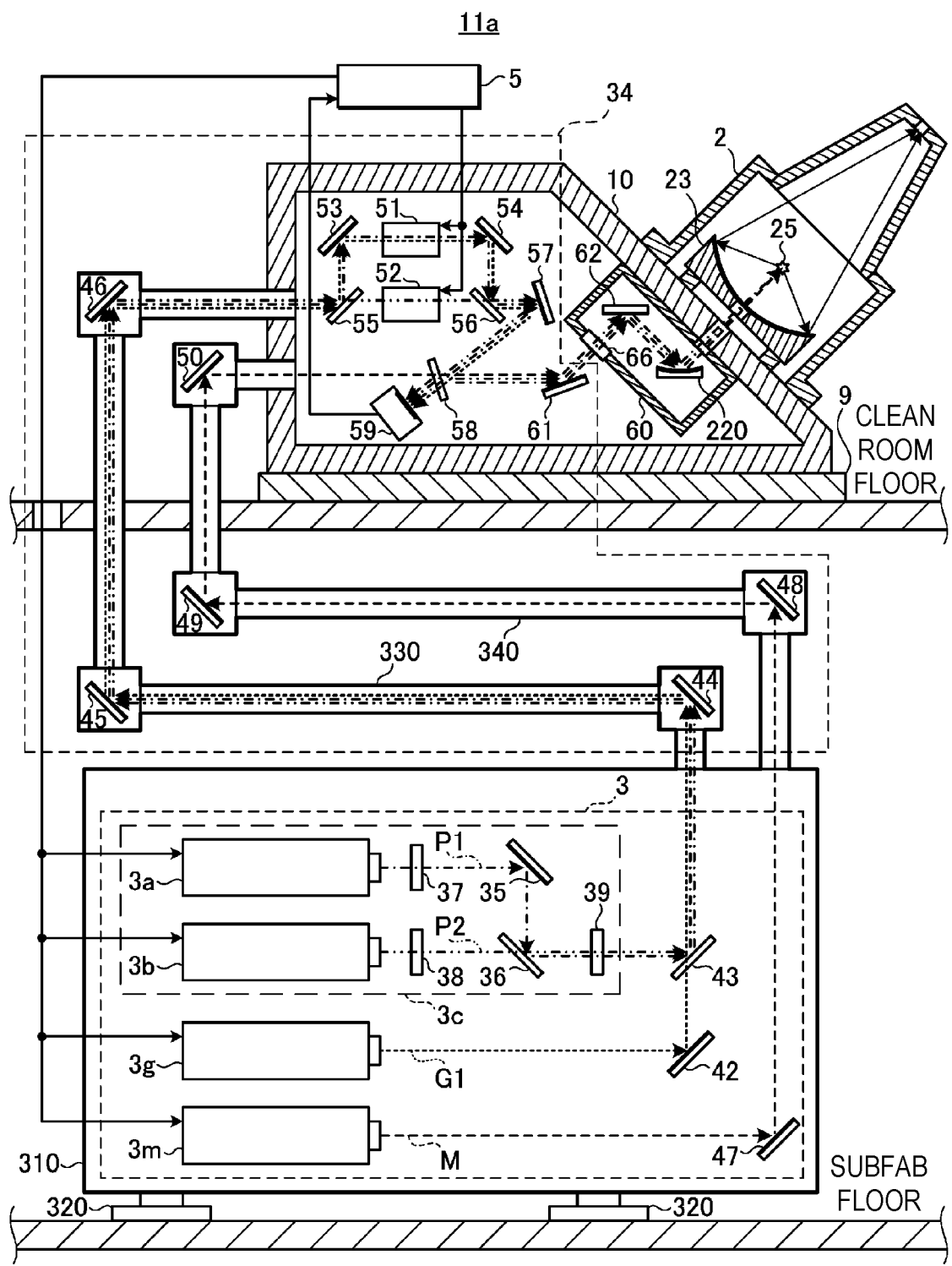
FIG. 2 is a partial sectional view of a configuration of an EUV light generation system 11a according to a comparative example.

2. EUV Light Generation System According to Comparative Example 2.1 Configuration FIG. 2 is a partial sectional view of a configuration of an EUV light generation system 11a according to a comparative example. Among components included in the EUV light generation system 11a, a chamber 2 is arranged on a clean room floor, and a laser system 3 is arranged on a subfab floor. The subfab floor is located below the clean room floor. A laser beam traveling direction control unit 34 for guiding a laser beam from the laser system 3 into the chamber 2 is arranged across the clean room floor and the subfab floor. The laser system 3 is secured in a housing 310 by a securing device (not shown). The housing 310 is installed on the subfab floor by a plurality of air suspensions 320.

2.1.1 Laser System 3

The laser system 3 includes a first pre-pulse laser apparatus 3a, a second pre-pulse laser apparatus 3b, a guide laser apparatus 3g, and a main pulse laser apparatus 3m.

The first pre-pulse laser apparatus 3a includes a first oscillator configured to output a first pre-pulse laser beam P1 having a first wavelength component.

The second pre-pulse laser apparatus 3b includes a second oscillator configured to output a second pre-pulse laser beam P2 having the first wavelength component which is the same as the wavelength component of the first pre-pulse laser beam P1.

The first pre-pulse laser beam P1 and the second pre-pulse laser beam P2 have, for example, a wavelength of 1.064 μm. The first pre-pulse laser beam P1 and the second pre-pulse laser beam P2 are, for example, linear-polarized laser beams. The first pre-pulse laser beam P1 has, for example, a pulse width of picosecond order, and the second pre-pulse laser beam P2 has, for example, a pulse width of nanosecond order.

The wavelength component of the first pre-pulse laser beam P1 and the wavelength component of the second pre-pulse laser beam P2 are both described as the first wavelength component, but the wavelength component of the first pre-pulse laser beam P1 and the wavelength component of the second pre-pulse laser beam P2 need not be exactly the same. The wavelength component of the first pre-pulse laser beam P1 may be different from the wavelength component of the second pre-pulse laser beam P2 as long as there is no substantial disadvantage in wavelength selectivity property of a dichroic mirror 43 described later. For example, the first pre-pulse laser apparatus 3a and the second pre-pulse laser apparatus 3b may be any combination of two selected from below:

a Yb:YAG laser apparatus configured to output a laser beam having a wavelength of 1.030 μm;

an Nd:YLF laser apparatus configured to output a laser beam having a wavelength of 1.047 μm;

an Nd:YLF laser apparatus configured to output a laser beam having a wavelength of 1.053 µm; and an Nd:YAG laser apparatus configured to output a laser beam having a wavelength of 1.064 µm.

The guide laser apparatus $3g$ is configured to output a first guide laser beam G1 having a second wavelength component. The second wavelength component is different from the first wavelength component. The first guide laser beam G1 has, for example, a wavelength of 0.66 µm. With the second wavelength component being a wavelength component of a visible light, presence or absence of output of the first guide laser beam G1 and a position of an optical path of the first guide laser beam G1 can be easily checked. The first guide laser beam G1 is, for example, a linear-polarized laser beam. The first guide laser beam G1 may be a pulse laser beam or a continuous wave laser beam. The first guide laser beam G1 has lower light intensity than the first pre-pulse laser beam P1 and the second pre-pulse laser beam P2. The guide laser apparatus $3g$ is constituted by, for example, a semiconductor laser.

The main pulse laser apparatus $3m$ is configured to output a main pulse laser beam M having a third wavelength component. The third wavelength component is different from the first wavelength component and the second wavelength component. The main pulse laser beam M has, for example, a wavelength of 10.6 µm. The main pulse laser beam M has higher light intensity than the first pre-pulse laser beam P1 and the second pre-pulse laser beam P2. The main pulse laser apparatus $3m$ is constituted by, for example, a $CO_2$ laser apparatus.

2.1.1.1 Optical Paths of First and Second Pre-Pulse Laser Beams P1, P2

The laser system 3 further includes wave plates 37, 38, 39, a polarization beam splitter 36, a dichroic mirror 43, and high reflection mirrors 35, 42, 47.

The wave plate 37 is configured to change a polarization state of the first pre-pulse laser beam P1 so that the first pre-pulse laser beam P1 output from the first pre-pulse laser apparatus $3a$ is linear-polarized to have the first polarization component when entering the polarization beam splitter 36. The wave plate 37 corresponds to a first wave plate in the present disclosure.

The wave plate 37 includes, for example, a half-wave plate. The wave plate 37 may be dispensed with if the first pre-pulse laser apparatus $3a$ outputs the first pre-pulse laser beam P1 linear-polarized to have the first polarization component when entering the polarization beam splitter 36. The first pre-pulse laser apparatus $3a$ or a combination of the first pre-pulse laser apparatus $3a$ and the wave plate 37 corresponds to a first laser apparatus in the present disclosure.

The wave plate 38 is configured to change a polarization state of the second pre-pulse laser beam P2 so that the second pre-pulse laser beam P2 output from the second pre-pulse laser apparatus $3b$ is linear-polarized to have the second polarization component when entering the polarization beam splitter 36. The wave plate 38 corresponds to a second wave plate in the present disclosure. The second polarization component is different from the first polarization component. The second polarization component is substantially perpendicular to the first polarization component.

Being "substantially perpendicular" does not require being exactly 90 degrees, but includes errors within a practical range. For example, when a light amount of transmitted P-polarized light in a polarization direction parallel to a plane of incidence on the polarization beam splitter is 1, a theoretical value of a light amount of transmitted linear-polarized light in a polarization direction shifted by 6 degrees from the plane of incidence is 0.99. Similarly, when a light amount of reflected S-polarized light in a polarization direction perpendicular to the plane of incidence on the polarization beam splitter is 1, a theoretical value of a light amount of reflected linear-polarized light in a polarization direction shifted by 6 degrees is 0.99. From the above, "substantially perpendicular" can refer to a range of 90±6 degrees. If a theoretical value of the light amount of the transmitted light or the reflected light may decrease to 0.97, "substantially perpendicular" can refer to a range of 90±10 degrees.

The wave plate 38 includes, for example, a half-wave plate. The wave plate 38 may be dispensed with if the second pre-pulse laser apparatus $3b$ outputs the second pre-pulse laser beam P2 linear-polarized to have the second polarization component when entering the polarization beam splitter 36. The second pre-pulse laser apparatus $3b$ or a combination of the second pre-pulse laser apparatus $3b$ and the wave plate 38 corresponds to a second laser apparatus in the present disclosure.

The high reflection mirror 35 is configured to reflect the first pre-pulse laser beam P1 having passed through the wave plate 37 with high reflectance.

The polarization beam splitter 36 is arranged in a position of intersection between an optical path of the first pre-pulse laser beam P1 reflected by the high reflection mirror 35 and an optical path of the second pre-pulse laser beam P2 having passed through the wave plate 38.

The polarization beam splitter 36 is configured to reflect the first pre-pulse laser beam P1 having the first polarization component with high reflectance, and to transmit the second pre-pulse laser beam P2 having the second polarization component with high transmittance. In this case, the first polarization component is an S-polarized component entering the polarization beam splitter 36, and the second polarization component is a P-polarized component entering the polarization beam splitter 36.

Alternatively, the polarization beam splitter 36 may be configured to transmit the first pre-pulse laser beam P1 having the first polarization component with high transmittance, and to reflect the second pre-pulse laser beam P2 having the second polarization component with high reflectance. This case is not shown. In this case, the first polarization component is a P-polarized component entering the polarization beam splitter 36, and the second polarization component is an S-polarized component entering the polarization beam splitter 36.

The first pre-pulse laser beam P1 and the second pre-pulse laser beam P2 are emitted from the polarization beam splitter 36 with their optical path axes being substantially matched. The optical paths of the first pre-pulse laser beam P1 and the second pre-pulse laser beam P2 emitted from the polarization beam splitter 36 are referred to as a first optical path. The polarization beam splitter 36 corresponds to a second polarization beam splitter in the present disclosure.

S-polarization and P-polarization are determined by a relative relationship with the plane of incidence. Thus, for example, the first pre-pulse laser beam P1 may be S-polarized or P-polarized according to an orientation of the plane of incidence. Also, if the laser beams are transmitted via the plurality of high reflection mirrors, the polarization directions of the laser beams may be changed relative to a horizontal plane. After the polarization beam splitter 36 substantially matches the optical path axes of the first pre-pulse laser beam P1 and the second pre-pulse laser beam P2, a difference between the polarization directions of the laser beams is maintained. Thus, in the present disclosure, the polarization component of the first pre-pulse laser beam P1 having passed through the wave plate 37 is defined as the first polarization component irrespective of S-polarization or P-polarization or the change in the polarization direction relative to the horizontal plane. Then, the polarization component different from the first polarization component is defined as the second polarization component.

The wave plate 39 is configured to change the polarization states of the first pre-pulse laser beam P1 and the second pre-pulse laser beam P2 emitted from the polarization beam splitter 36 with the difference between the polarization directions of the laser beams being maintained. For example, the wave plate 39 changes the polarization direction of the first pre-pulse laser beam P1 so that the first pre-pulse laser beam P1 is S-polarized when entering a polarization beam splitter 55 described later. Simultaneously, the wave plate 39 changes the polarization state of the second pre-pulse laser beam P2 so that the second pre-pulse laser beam P2 is P-polarized when entering the polarization beam splitter 55. The wave plate 39 includes, for example, a half-wave plate. The wave plate 39 corresponds to a third wave plate in the present disclosure.

The wave plate 39 may be dispensed with if the following two conditions are satisfied:

(1) The first pre-pulse laser beam P1 emitted from the polarization beam splitter 36 is S-polarized when entering the polarization beam splitter 55 even without passing through the wave plate 39.

(2) The second pre-pulse laser beam P2 emitted from the polarization beam splitter 36 is P-polarized when entering the polarization beam splitter 55 even without passing through the wave plate 39.

The first pre-pulse laser apparatus 3a, the second pre-pulse laser apparatus 3b, the wave plates 37, 38, 39, the polarization beam splitter 36, and the high reflection mirror 35 constitute a pre-pulse laser system 3c. The pre-pulse laser system 3c outputs the first pre-pulse laser beam P1 and the second pre-pulse laser beam P2 along the first optical path. The pre-pulse laser system 3c corresponds to a pulse laser system in the present disclosure.

The reason for substantially matching the optical path axes of the first pre-pulse laser beam P1 and the second pre-pulse laser beam P2 as described above are as follows. Transmission paths of the first pre-pulse laser beam P1 and the second pre-pulse laser beam P2 from the subfab floor to the clean room floor may have a length of several tens of meters. Substantially matching the optical path axes of the first pre-pulse laser beam P1 and the second pre-pulse laser beam P2 can reduce the number of required optical elements included in the laser beam traveling direction control unit 34, and integrate an optical path tube 330 described later.

2.1.1.2 Optical Path of First Guide Laser Beam G1

The high reflection mirror 42 is configured to reflect the first guide laser beam G1 output from the guide laser apparatus 3g with high reflectance.

The dichroic mirror 43 is arranged in a position of intersection between the optical paths of the first pre-pulse laser beam P1 and the second pre-pulse laser beam P2 output from the pre-pulse laser system 3c and the optical path of the first guide laser beam G1 reflected by the high reflection mirror 42. The first pre-pulse laser beam P1 and the second pre-pulse laser beam P2 enter a first surface of the dichroic mirror 43. The first guide laser beam G1 enters a second surface of the dichroic mirror 43. The first surface and the second surface are opposite surfaces.

The dichroic mirror 43 is configured to reflect the first pre-pulse laser beam P1 and the second pre-pulse laser beam P2 having the first wavelength component with high reflectance, and to transmit the first guide laser beam G1 having the second wavelength component with high transmittance. The first pre-pulse laser beam P1, the second pre-pulse laser beam P2, and the first guide laser beam G1 are emitted from the dichroic mirror 43 with their optical path axes being substantially matched. The optical paths of the first pre-pulse laser beam P1, the second pre-pulse laser beam P2, and the first guide laser beam G1 emitted from the dichroic mirror 43 are referred to as a fourth optical path.

As described above, the dichroic mirror 43 reflects the first pre-pulse laser beam P1 and the second pre-pulse laser beam P2, and transmits the first guide laser beam G1. The dichroic mirror 43 can be designed to have an attenuation factor of reflected light lower than that of transmitted light. This allows a low attenuation factor for the first pre-pulse laser beam P1 and the second pre-pulse laser beam P2 that require high energy for breaking or dispersing a target.

However, the present disclosure is not limited to this. The dichroic mirror 43 may be configured to transmit the first pre-pulse laser beam P1 and the second pre-pulse laser beam P2, and to reflect the first guide laser beam G1.

In the fourth optical path, the first guide laser beam G1 is linear-polarized to have the same polarization component as the first pre-pulse laser beam P1. Specifically, the guide laser apparatus 3g is configured to emit the first guide laser beam G1 linear-polarized to have the first polarization component in the fourth optical path.

Figure 3:
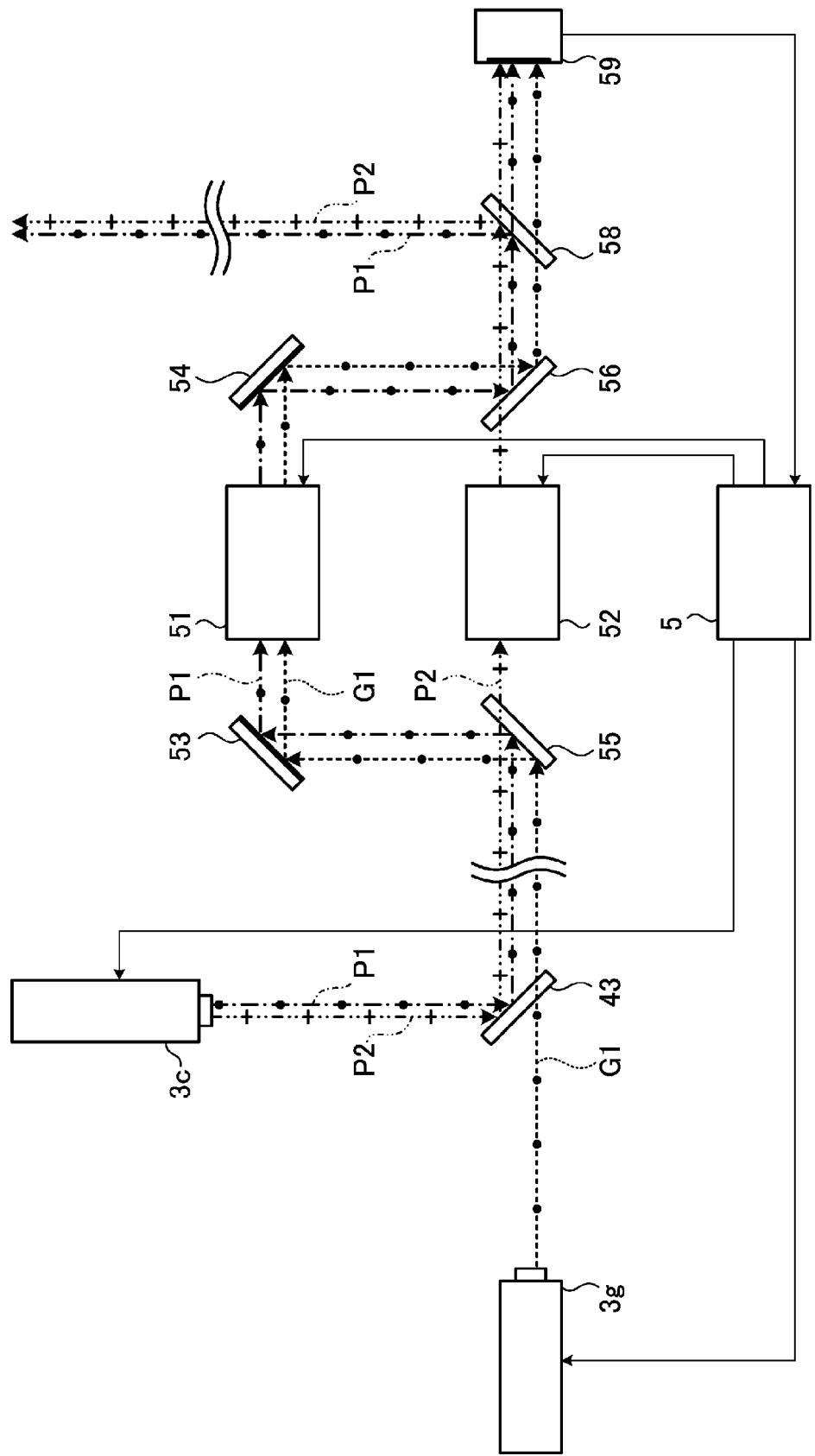
FIG. 3 shows optical paths of a first pre-pulse laser beam P1, a second pre-pulse laser beam P2, and a first guide laser beam G1 in a simplified manner.

FIG. 3 shows the optical paths of the first pre-pulse laser beam P1, the second pre-pulse laser beam P2, and the first guide laser beam G1 in a simplified manner. FIG. 3 does not show an internal configuration of the pre-pulse laser system 3c.

2.1.1.3 Optical Path of Main Pulse Laser Beam M

The high reflection mirror 47 is configured to reflect the main pulse laser beam M output from the main pulse laser apparatus 3m with high reflectance.

As described above, the laser system 3 outputs the first pre-pulse laser beam P1, the second pre-pulse laser beam P2, and the first guide laser beam G1 emitted from the dichroic mirror 43, and the main pulse laser beam M reflected by the high reflection mirror 47.

FIG. 3 does not show the main pulse laser apparatus 3m and an optical path of the main pulse laser beam M.

2.1.2 Laser Beam Traveling Direction Control Unit 34

2.1.2.1 Optical Path Tubes 330, 340

In a region across the subfab floor and the clean room floor, the laser beam traveling direction control unit 34 includes optical path tubes 330, 340. The optical path tubes 330, 340 are hollow. The optical path tubes 330, 340 are in a vacuum, or dry air or inert gas is introduced into the optical path tubes 330, 340.

In the optical path tube 330, a plurality of high reflection mirrors 44, 45, 46 are arranged. The high reflection mirrors 44, 45, 46 are held by mirror holders (not shown). The high reflection mirrors 44, 45, 46 are arranged so that the first pre-pulse laser beam P1, the second pre-pulse laser beam P2, and the first guide laser beam G1 output from the laser system 3 are guided to the clean room floor. The optical paths of the first pre-pulse laser beam P1, the second pre-pulse laser beam P2, and the first guide laser beam G1 reflected by the high reflection mirrors 44, 45, 46 also constitute the fourth optical path. FIG. 3 does not show the high reflection mirrors 44, 45, 46.

In the optical path tube 340, a plurality of high reflection mirrors 48, 49, 50 are arranged. The high reflection mirrors 48, 49, 50 are supported by mirror holders (not shown). The high reflection mirrors 48, 49, 50 are arranged so that the main pulse laser beam M output from the laser system 3 is guided to the clean room floor.

2.1.2.2 Chamber Reference Member 10

On the clean room floor, the chamber 2 is secured to a chamber reference member 10. An EUV condenser mirror 23 is arranged in the chamber 2. FIG. 2 and thereafter do not show the target supply unit 26 described with reference to FIG. 1. The EUV condenser mirror 23 is secured via a mirror holder to the chamber reference member 10. The chamber reference member 10 is secured on the clean room floor by an installation mechanism 9. The chamber reference member 10 houses a group of optical elements that constitute part of the laser beam traveling direction control unit 34.

In the chamber reference member 10, the laser beam traveling direction control unit 34 includes polarization beam splitters 55, 56, beam adjusting devices 51, 52, high reflection mirrors 53, 54, 57, 61, a beam splitter 58, and a beam monitor 59.

The polarization beam splitter 55 is arranged in the optical paths of the first pre-pulse laser beam P1, the second pre-pulse laser beam P2, and the first guide laser beam G1 guided to the clean room floor by the high reflection mirrors 44, 45, 46.

The polarization beam splitter 55 is configured to reflect the first pre-pulse laser beam P1 and the first guide laser beam G1 having the first polarization component with high reflectance, and to transmit the second pre-pulse laser beam P2 having the second polarization component with high transmittance. Specifically, the first polarization component is an S-polarized component entering the polarization beam splitter 55, and the second polarization component is a P-polarized component entering the polarization beam splitter 55.

The high reflection mirror 53 is configured to reflect, with high reflectance, the first pre-pulse laser beam P1 and the first guide laser beam G1 reflected by the polarization beam splitter 55.

The beam adjusting device 51 is arranged in the optical paths of the first pre-pulse laser beam P1 and the first guide laser beam G1 reflected by the high reflection mirror 53. The beam adjusting device 51 is configured to adjust beam parameters of the first pre-pulse laser beam P1 and the first guide laser beam G1. The beam adjusting device 51 corresponds to a first beam adjusting device in the present disclosure.

In the present disclosure, the beam parameter includes, for example, a beam position and a beam pointing. The beam position refers to a position of a beam at the beam monitor 59. The beam pointing refers to a beam traveling direction. In addition to or alternatively to the beam position and the beam pointing, the beam parameter may include a beam diameter or a beam divergence. The beam diameter refers to a beam diameter at the beam monitor 59. The beam divergence refers to a divergent angle of a diverging beam or a convergent angle of a converging beam at the beam monitor 59.

The optical paths of the first pre-pulse laser beam P1 and the first guide laser beam G1 emitted from the beam adjusting device 51 are referred to as a fifth optical path. The high reflection mirror 54 is configured to reflect, with high reflectance, the first pre-pulse laser beam P1 and the first guide laser beam G1 having passed through the beam adjusting device 51. The optical paths of the first pre-pulse laser beam P1 and the first guide laser beam G1 reflected by the high reflection mirror 54 also constitute the fifth optical path.

The beam adjusting device 52 is arranged in the optical path of the second pre-pulse laser beam P2 having passed through the polarization beam splitter 55. The beam adjusting device 52 is configured to adjust a beam parameter of the second pre-pulse laser beam P2. The beam adjusting device 52 corresponds to a second beam adjusting device in the present disclosure. The optical path of the second pre-pulse laser beam P2 emitted from the beam adjusting device 52 is referred to as a sixth optical path.

As described above, the first pre-pulse laser beam P1 and the second pre-pulse laser beam P2 having passed through a common transmission path are split by the polarization beam splitter 55, and thus the beam parameters of the first pre-pulse laser beam P1 and the second pre-pulse laser beam P2 can be separately adjusted. This allows the first pre-pulse laser beam P1 and the second pre-pulse laser beam P2 to be applied to the target under appropriate application conditions.

The polarization beam splitter 56 is arranged in a position of intersection between the optical paths of the first pre-pulse laser beam P1 and the first guide laser beam G1 reflected by the high reflection mirror 54 and the optical path of the second pre-pulse laser beam P2 having passed through the beam adjusting device 52. The first pre-pulse laser beam P1 and the first guide laser beam G1 enter a third surface of the polarization beam splitter 56. The second pre-pulse laser beam P2 enters a fourth surface of the polarization beam splitter 56. The third surface and the fourth surface are opposite surfaces. The polarization beam splitter 56 corresponds to a third polarization beam splitter in the present disclosure.

The polarization beam splitter 56 is configured to reflect the first pre-pulse laser beam P1 and the first guide laser beam G1 having the first polarization component with high reflectance, and to transmit the second pre-pulse laser beam P2 having the second polarization component with high transmittance. In this case, the first polarization component is an S-polarized component entering the polarization beam splitter 56, and the second polarization component is a P-polarized component entering the polarization beam splitter 56.

Alternatively, the polarization beam splitter 56 may be configured to transmit the first pre-pulse laser beam P1 and the first guide laser beam G1 having the first polarization component with high transmittance, and to reflect the second pre-pulse laser beam P2 having the second polarization component with high reflectance. This case is not shown. In this case, the first polarization component is a P-polarized component entering the polarization beam splitter 56, and the second polarization component is an S-polarized component entering the polarization beam splitter 56.

The first pre-pulse laser beam P1, the second pre-pulse laser beam P2, and the first guide laser beam G1 are emitted from the polarization beam splitter 56 with their optical path axes being substantially matched. The optical paths of the first pre-pulse laser beam P1, the second pre-pulse laser beam P2, and the first guide laser beam G1 emitted from the polarization beam splitter 56 are referred to as a seventh optical path.

The high reflection mirror 57 is configured to reflect, with high reflectance, the first pre-pulse laser beam P1, the second pre-pulse laser beam P2, and the first guide laser beam G1 emitted from the polarization beam splitter 56.

The beam splitter 58 is arranged in a position of intersection between the optical paths of the first pre-pulse laser beam P1, the second pre-pulse laser beam P2, and the first guide laser beam G1 reflected by the high reflection mirror 57, and the optical path of the main pulse laser beam M having reached the clean room floor.

The beam splitter 58 is constituted by, for example, a dichroic mirror. The beam splitter 58 is configured to reflect most of the first pre-pulse laser beam P1 and most of the second pre-pulse laser beam P2, and to transmit most of the main pulse laser beam M.

The first pre-pulse laser beam P1 and the second pre-pulse laser beam P2 reflected by the beam splitter 58 and the main pulse laser beam M having passed through the beam splitter 58 are emitted toward the high reflection mirror 61 with their optical path axes being substantially matched.

The beam splitter 58 is further configured to transmit part of the first pre-pulse laser beam P1 and part of the second pre-pulse laser beam P2. The beam splitter 58 is further configured to transmit at least part of the first guide laser beam G1. The beam splitter 58 is further configured to reflect part of the main pulse laser beam M.

The first pre-pulse laser beam P1, the second pre-pulse laser beam P2, and the first guide laser beam G1 having passed through the beam splitter 58 and the main pulse laser beam M reflected by the beam splitter 58 are emitted toward the beam monitor 59 with their optical path axes being substantially matched. The optical paths of the first pre-pulse laser beam P1, the second pre-pulse laser beam P2, and the first guide laser beam G1 reflected by the high reflection mirror 57 and having passed through the beam splitter 58 also constitute the seventh optical path.

The beam monitor 59 is arranged in the optical paths of the first pre-pulse laser beam P1, the second pre-pulse laser beam P2, and the first guide laser beam G1 having passed through the beam splitter 58 and the main pulse laser beam M reflected by the beam splitter 58. The beam monitor 59 is configured to detect the first pre-pulse laser beam P1, the second pre-pulse laser beam P2, and the first guide laser beam G1. The beam monitor 59 may be further configured to detect the main pulse laser beam M. The beam monitor 59 outputs, to the EUV light generation control unit 5, data allowing calculation of the beam parameters of the laser beams.

The EUV light generation control unit 5 is configured to calculate the beam parameter of the first pre-pulse laser beam P1 or the first guide laser beam G1 based on the data received from the beam monitor 59. The EUV light generation control unit 5 is configured to control the beam adjusting device 51 based on the calculated beam parameter.

The EUV light generation control unit 5 is configured to calculate the beam parameter of the second pre-pulse laser beam P2 based on the data received from the beam monitor 59. The EUV light generation control unit 5 is configured to control the beam adjusting device 52 based on the calculated beam parameter.

The high reflection mirror 61 is arranged in the optical paths of the first pre-pulse laser beam P1 and the second pre-pulse laser beam P2 reflected by the beam splitter 58 and the main pulse laser beam M having passed through the beam splitter 58. The high reflection mirror 61 is configured to reflect the first pre-pulse laser beam P1, the second pre-pulse laser beam P2, and the main pulse laser beam M with high reflectance, and to emit the laser beams to the outside of the laser beam traveling direction control unit 34.

2.1.3 Mirror Housing Container 60

In the chamber reference member 10, a mirror housing container 60 is arranged. The mirror housing container 60 includes a window 66. In the mirror housing container 60, a high reflection mirror 62 and a laser beam collecting optical system 220 are arranged.

The window 66 transmits, into the mirror housing container 60 with high transmittance, the first pre-pulse laser beam P1, the second pre-pulse laser beam P2, and the main pulse laser beam M reflected by the high reflection mirror 61.

The high reflection mirror 62 reflects, with high reflectance, the first pre-pulse laser beam P1, the second pre-pulse laser beam P2, and the main pulse laser beam M having passed through the window 66.

The laser beam collecting optical system 220 reflects, with high reflectance, the first pre-pulse laser beam P1, the second pre-pulse laser beam P2, and the main pulse laser beam M reflected by the high reflection mirror 62, and focuses the laser beams on the plasma generating region 25.

2.2 Operation

Figure 4:
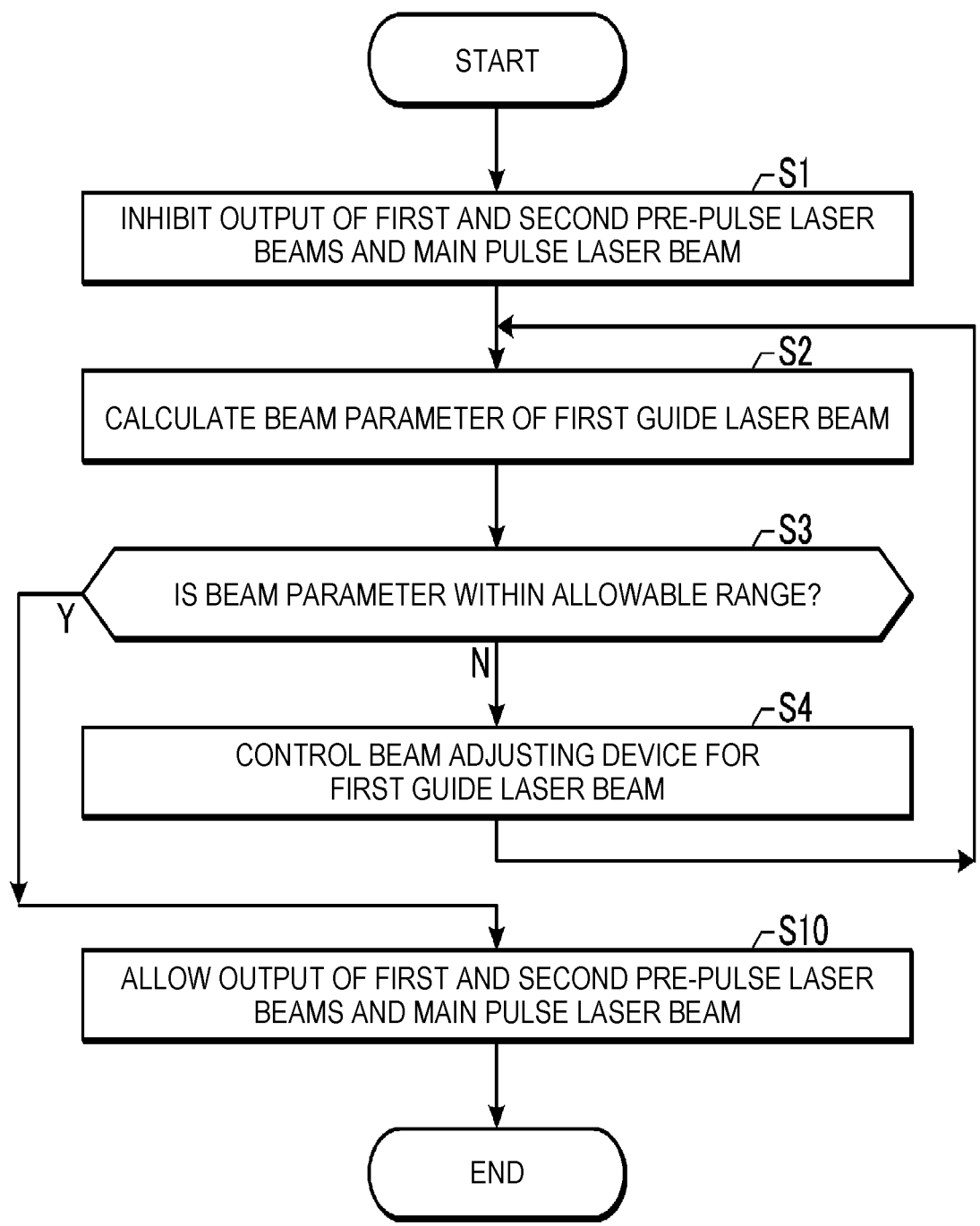
FIG. 4 is a flowchart of a beam adjusting operation for the first pre-pulse laser beam P1 in the comparative example.

FIG. 4 is a flowchart of a beam adjusting operation for the first pre-pulse laser beam P1 in the comparative example. The EUV light generation control unit 5 controls the beam adjusting device 51 based on the data output from the beam monitor 59 according to processing in FIG. 4. In flowcharts included in the present disclosure, N denotes determination of NO, and Y denotes determination of YES.

First in S1, the EUV light generation control unit 5 inhibits output of the first pre-pulse laser beam P1, the second pre-pulse laser beam P2, and the main pulse laser beam M. This stops the output of the pulse laser beams from the first pre-pulse laser apparatus 3a, the second pre-pulse laser apparatus 3b, and the main pulse laser apparatus 3m. However, output of the first guide laser beam G1 is not inhibited.

Then, in S2, the EUV light generation control unit 5 receives the data output from the beam monitor 59. The EUV light generation control unit 5 calculates the beam parameter of the first guide laser beam G1 based on the received data.

Then, in S3, the EUV light generation control unit 5 determines whether or not the calculated beam parameter of the first guide laser beam G1 is within an allowable range. For example, if the beam parameter of the first guide laser beam G1 represents a value out of the allowable range, the EUV light generation control unit 5 determines that a detection result is not within the allowable range. The beam parameter of the first guide laser beam G1 may represent a value out of the allowable range due to, for example, deformation of the high reflection mirrors 44, 45, 46 or the like or misalignment of the first pre-pulse laser apparatus 3a.

In S3, if it is determined that the beam parameter of the first guide laser beam G1 is not within the allowable range (NO in S3), the EUV light generation control unit 5 goes to a process in S4. In S4, the EUV light generation control unit 5 controls the beam adjusting device 51 so that the beam parameter of the first guide laser beam G1 is within the allowable range. After S4, the EUV light generation control unit 5 returns to the process in S2, again receives the data output from the beam monitor 59, and again calculates the beam parameter of the first guide laser beam G1.

In S3, if it is determined that the beam parameter of the first guide laser beam G1 is within the allowable range (YES in S3), the EUV light generation control unit 5 goes to a process in S10. In S10, the EUV light generation control unit 5 allows the output of the first pre-pulse laser beam P1, the second pre-pulse laser beam P2, and the main pulse laser beam M. Thus, the first pre-pulse laser apparatus 3a, the second pre-pulse laser apparatus 3b, and the main pulse laser apparatus 3m start the output of the pulse laser beams. After S10, the EUV light generation control unit 5 finishes the processing in this flowchart.

The first pre-pulse laser beam P1, the second pre-pulse laser beam P2, and the main pulse laser beam M are applied to the same target in this order. When the first pre-pulse laser beam P1 is applied to the target, the target is dispersed. When the second pre-pulse laser beam P2 is further applied to the target irradiated with the first pre-pulse laser beam P1, the target is further dispersed into fine particles. When the main pulse laser beam M is further applied to the target irradiated with the first pre-pulse laser beam P1 and the second pre-pulse laser beam P2, the target is excited and turned into plasma. Radiation light including EUV light is radiated from the target turned into plasma.

In the present disclosure, the order of application of the first pre-pulse laser beam P1 and the second pre-pulse laser beam P2 is not particularly limited. The second pre-pulse laser beam P2, the first pre-pulse laser beam P1, and the main pulse laser beam M may be applied to the same target in this order. In this case, the second pre-pulse laser beam P2 may have, for example, a pulse width of picosecond order, and the first pre-pulse laser beam P1 may have, for example, a pulse width of nanosecond order. The first pre-pulse laser beam P1 corresponds to a first laser beam in the present disclosure. The second pre-pulse laser beam P2 corresponds to a second laser beam in the present disclosure.

According to the above operation, the beam adjusting device 51 is controlled based on the detection result of the first guide laser beam G1 before the output of the first pre-pulse laser beam P1, the second pre-pulse laser beam P2, and the main pulse laser beam M. Thus, the first pre-pulse laser beam P1 can be applied to the target with high accuracy from the start of the output of the first pre-pulse laser beam P1.

After the start of the output of the first pre-pulse laser beam P1, the second pre-pulse laser beam P2, and the main pulse laser beam M, the beam monitor 59 can detect the first pre-pulse laser beam P1, the second pre-pulse laser beam P2, and the main pulse laser beam M. The EUV light generation control unit 5 can control the beam adjusting device 51 based on a detection result of the first pre-pulse laser beam P1 by the beam monitor 59. Further, the EUV light generation control unit 5 can control the beam adjusting device 52 based on a detection result of the second pre-pulse laser beam P2 by the beam monitor 59. Further, the EUV light generation control unit 5 can control a beam adjusting device (not shown) located in the optical path of the main pulse laser beam M based on a detection result of the main pulse laser beam M by the beam monitor 59.

2.3 Problem

In the above configuration, the first pre-pulse laser beam P1 can be applied to the target with high accuracy from the start of the output of the first pre-pulse laser beam P1. However, the second pre-pulse laser beam P2 can be adjusted only after the start of the output of the second pre-pulse laser beam P2. Thus, at the start of the output of the second pre-pulse laser beam P2, the second pre-pulse laser beam P2 may be applied with insufficient accuracy. The second pre-pulse laser beam P2 applied with insufficient accuracy may prevent the target from being sufficiently dispersed into fine particles, and fragments of the target may adhere to the optical element such as the EUV condenser mirror 23 and degrade performance of the optical element.

3. EUV Light Generation System Including Polarization Conversion Mechanism 3.1 Outline In an embodiment described below, a guide laser apparatus 3g outputs a guide laser beam G. A polarization conversion mechanism 41 is arranged in an optical path of the guide laser beam G. The polarization conversion mechanism 41 is configured to be able to switch between a first state in which the guide laser beam G is a first guide laser beam G1 having a first polarization component, and a second state in which the guide laser beam G is a second guide laser beam G2 having a second polarization component.

Further, a polarization beam splitter 55 is configured to reflect a first pre-pulse laser beam P1 and the first guide laser beam G1 having the first polarization component, and to transmit a second pre-pulse laser beam P2 and the second guide laser beam G2 having the second polarization component. Specifically, the polarization beam splitter 55 is constituted by a two-wavelength polarization beam splitter. A polarization beam splitter 56 is also constituted by a two-wavelength polarization beam splitter. The two-wavelength polarization beam splitter can change, according to a polarization direction, an optical path of a first wavelength component of the first and second pre-pulse laser beams P1, P2, and also an optical path of a second wavelength component of the first and second guide laser beams G1, G2.

In the first state of the polarization conversion mechanism 41, the guide laser beam G is the first guide laser beam G1. In this case, an EUV light generation control unit 5 can control a beam adjusting device 51 based on a detection result of the first guide laser beam G1. In the second state of the polarization conversion mechanism 41, the guide laser beam G is the second guide laser beam G2. In this case, the EUV light generation control unit 5 can control a beam adjusting device 52 based on a detection result of the second guide laser beam G2. Thus, before output of the first pre-pulse laser beam P1 and the second pre-pulse laser beam P2, the first guide laser beam G1 and the second guide laser beam G2 can be detected to control the beam adjusting device 51 and the beam adjusting device 52.

3.2 Configuration 3.2.1 Laser System 3

Figure 5:
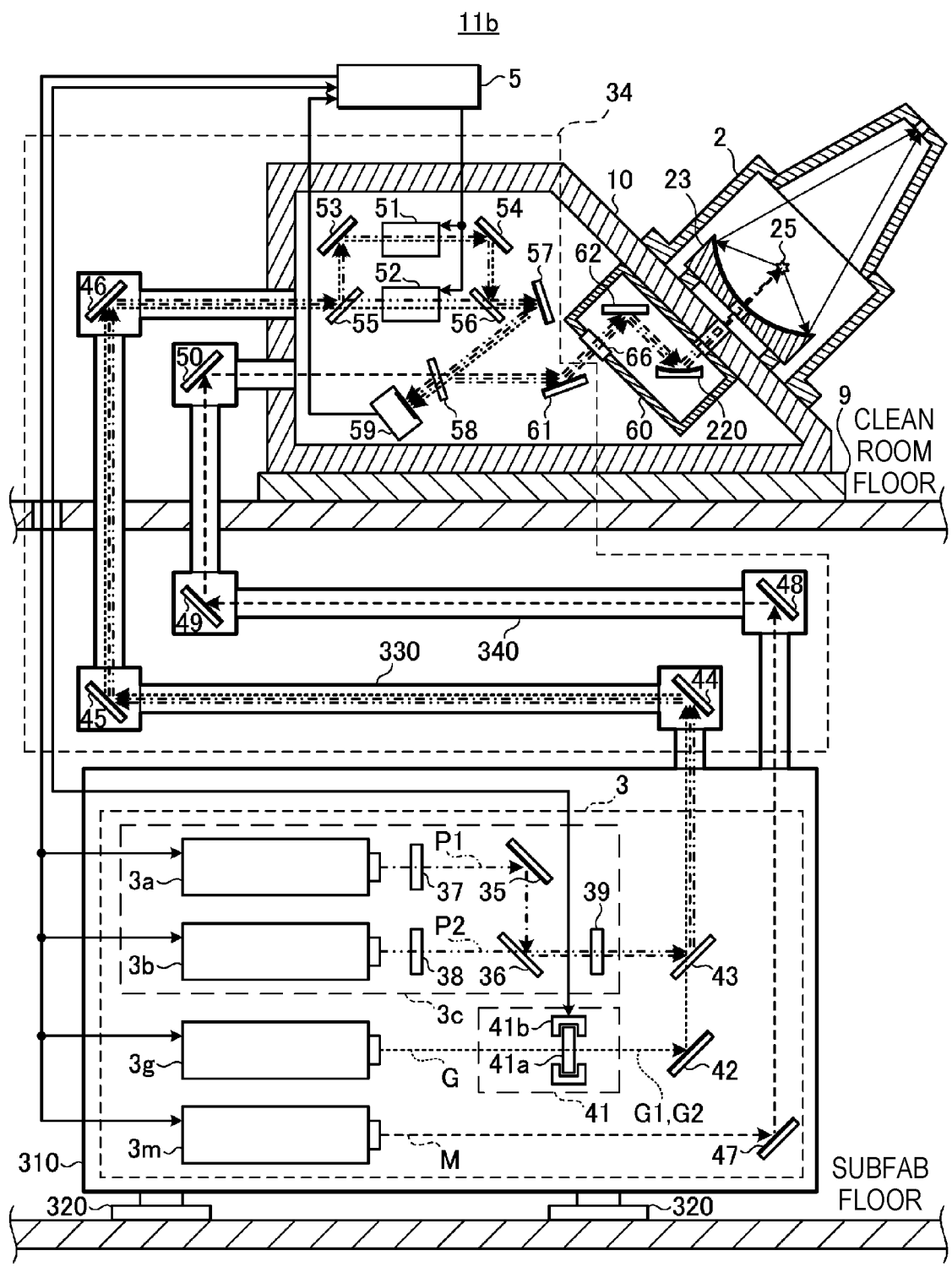
FIG. 5 is a partial sectional view of a configuration of an EUV light generation system 11b according to a first embodiment of the present disclosure.
Figure 6:
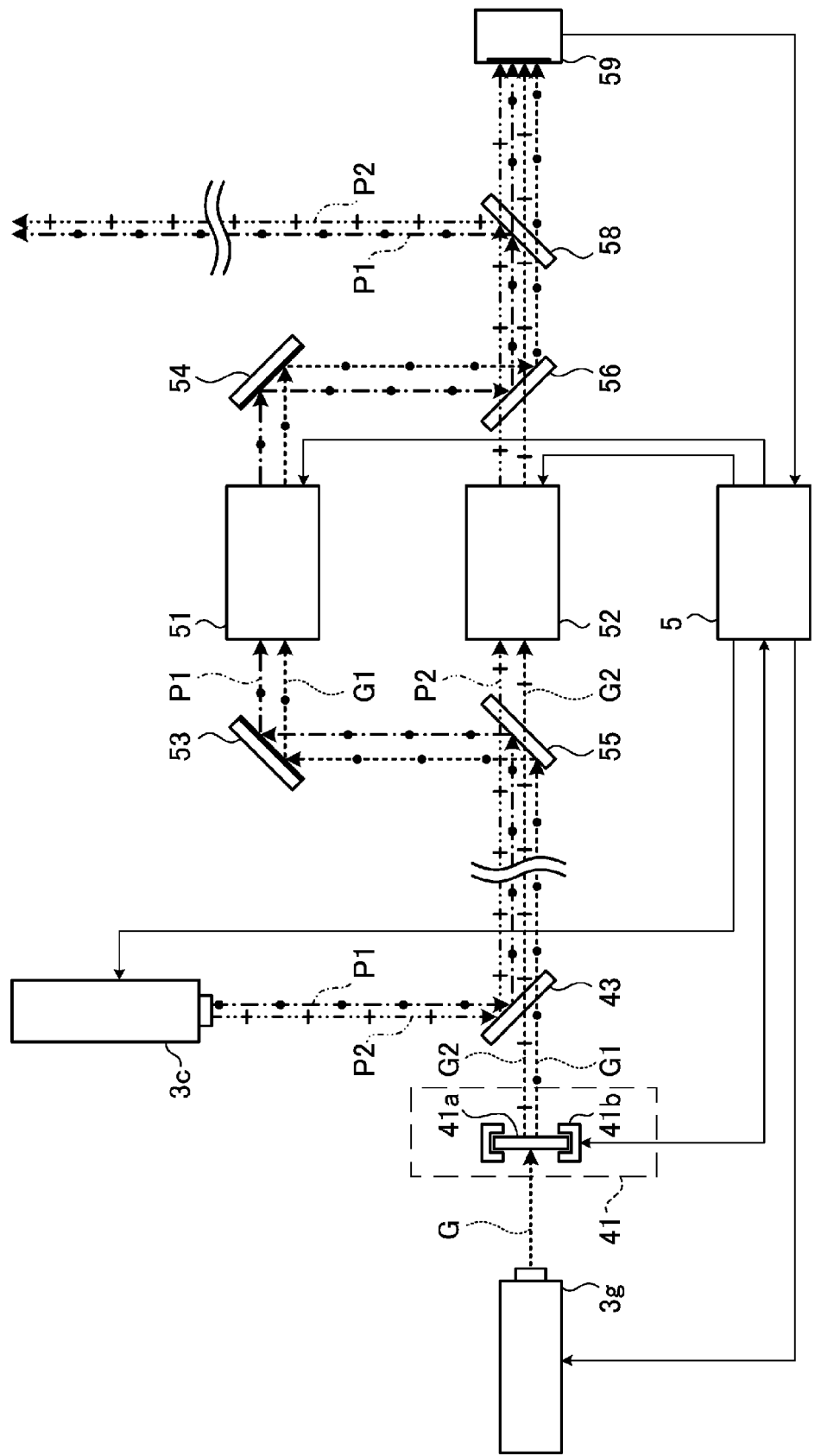
FIG. 6 shows optical paths of a first pre-pulse laser beam P1, a second pre-pulse laser beam P2, a first guide laser beam G1, and a second guide laser beam G2 in a simplified manner.

FIG. 5 is a partial sectional view of a configuration of an EUV light generation system 11b according to a first embodiment of the present disclosure. FIG. 6 shows optical paths of the first pre-pulse laser beam P1, the second pre-pulse laser beam P2, the first guide laser beam G1, and the second guide laser beam G2 in a simplified manner. FIG. 6 does not show an internal configuration of a pre-pulse laser system 3c.

A guide laser apparatus 3g is configured to output a linear-polarized guide laser beam G having the second wavelength component. The guide laser beam G output from the guide laser apparatus 3g corresponds to a third laser beam in the present disclosure. An optical path of the guide laser beam G output from the guide laser apparatus 3g is referred to as a second optical path. The polarization conversion mechanism 41 is arranged in the second optical path. The polarization conversion mechanism 41 includes a half-wave plate 41a and a rotation mechanism 41b.

The linear-polarized guide laser beam G enters the half-wave plate 41a. With an angle between a direction of an optical axis of a crystal of the half-wave plate 41a and a polarization direction of the guide laser beam G being θ, the half-wave plate 41a rotates the polarization direction of the guide laser beam G by 2θ. Specifically, with the angle θ of 45 degrees, the half-wave plate 41a rotates the polarization direction of the guide laser beam G by 90 degrees and transmits the guide laser beam G. With the angle θ of 0 degree, the half-wave plate 41a transmits the guide laser beam G without changing the polarization direction of the guide laser beam G.

The rotation mechanism 41b is configured to rotate the half-wave plate 41a around an axis parallel to a traveling direction of the guide laser beam G. The rotation mechanism 41b is controlled by the EUV light generation control unit 5. The EUV light generation control unit 5 corresponds to a controller configured to control the rotation mechanism. The rotation mechanism 41b is configured to rotate the half-wave plate 41a by a predetermined angle and to be thus able to switch the polarization conversion mechanism 41 between the first state and the second state. In the first state, the polarization conversion mechanism 41 that the guide laser beam G has entered emits the first guide laser beam G1 having the first polarization component. In the second state, the polarization conversion mechanism 41 that the guide laser beam G has entered emits the second guide laser beam G2 having the second polarization component. As such, the polarization conversion mechanism 41 is configured to selectively emit the first guide laser beam G1 and the second guide laser beam G2. The rotation mechanism 41b desirably includes a rotary encoder configured to measure a rotation angle of the half-wave plate 41a and to output the rotation angle to the EUV light generation control unit 5. This can increase accuracy of the polarization conversion mechanism 41.

The first guide laser beam G1 and the second guide laser beam G2 emitted from the polarization conversion mechanism 41 pass through substantially the same optical paths and enter a high reflection mirror 42. The optical paths of the first guide laser beam G1 and the second guide laser beam G2 emitted from the polarization conversion mechanism 41 are referred to as a third optical path.

The first guide laser beam G1 and the second guide laser beam G2 are both reflected by the high reflection mirror 42. The optical paths of the first guide laser beam G1 and the second guide laser beam G2 reflected by the high reflection mirror 42 also constitute the third optical path.

The first guide laser beam G1 and the second guide laser beam G2 both pass through a dichroic mirror 43.

3.2.2 Laser Beam Traveling Direction Control Unit 34

The first guide laser beam G1 is guided to a clean room floor by high reflection mirrors 44, 45, 46 like the first guide laser beam G1 in the comparative example. Then, like the first guide laser beam G1 in the comparative example, the first guide laser beam G1 passes through the same optical path as that of the first pre-pulse laser beam P1 and enters a beam monitor 59. Specifically, the first guide laser beam G1 passes through the beam adjusting device 51. The first guide laser beam G1 passes through a fourth optical path, a fifth optical path, and a seventh optical path as described above.

The second guide laser beam G2 is guided to the clean room floor by the high reflection mirrors 44, 45, 46 like the first guide laser beam G1 in the comparative example. Then, unlike the first guide laser beam G1 in the comparative example, the second guide laser beam G2 passes through the same optical path as that of the second pre-pulse laser beam P2 and enters the beam monitor 59. Specifically, the second guide laser beam G2 passes through the beam adjusting device 52. The second guide laser beam G2 passes through the fourth optical path, a sixth optical path, and the seventh optical path as described above.

The beam monitor 59 detects the first pre-pulse laser beam P1, the second pre-pulse laser beam P2, and the first guide laser beam G1, and also detects the second guide laser beam G2.

The EUV light generation control unit 5 is configured to control the beam adjusting device 51, and also to control the beam adjusting device 52. The EUV light generation control unit 5 controls the beam adjusting device 52 based on a beam parameter of the second guide laser beam G2. The EUV light generation control unit 5 corresponds to a controller configured to control first and second beam adjusting devices.

Other points are similar to those in the comparative example.

The beam monitor 59 has been described as being arranged on a downstream side of the optical paths of the first and second pre-pulse laser beams P1, P2 from the polarization beam splitter 56, but the present disclosure is not limited to this. A first beam monitor (not shown) may be arranged between the beam adjusting device 51 and the polarization beam splitter 56, and a second beam monitor (not shown) may be arranged between the beam adjusting device 52 and the polarization beam splitter 56. In this case, the EUV light generation control unit 5 may control the beam adjusting device 51 based on data output from the first beam monitor, and control the beam adjusting device 52 based on data output from the second beam monitor.

The polarization conversion mechanism 41 has been described as including the rotation mechanism 41b configured to rotate the half-wave plate 41a, but the present disclosure is not limited to this. The polarization conversion mechanism 41 may be configured to manually rotate the half-wave plate 41a.

The polarization conversion mechanism 41 has been described as including the half-wave plate 41a, but the present disclosure is not limited to this. The polarization conversion mechanism 41 may include, for example, a Dove prism or other image rotators.

3.3 Operation

Figure 7:
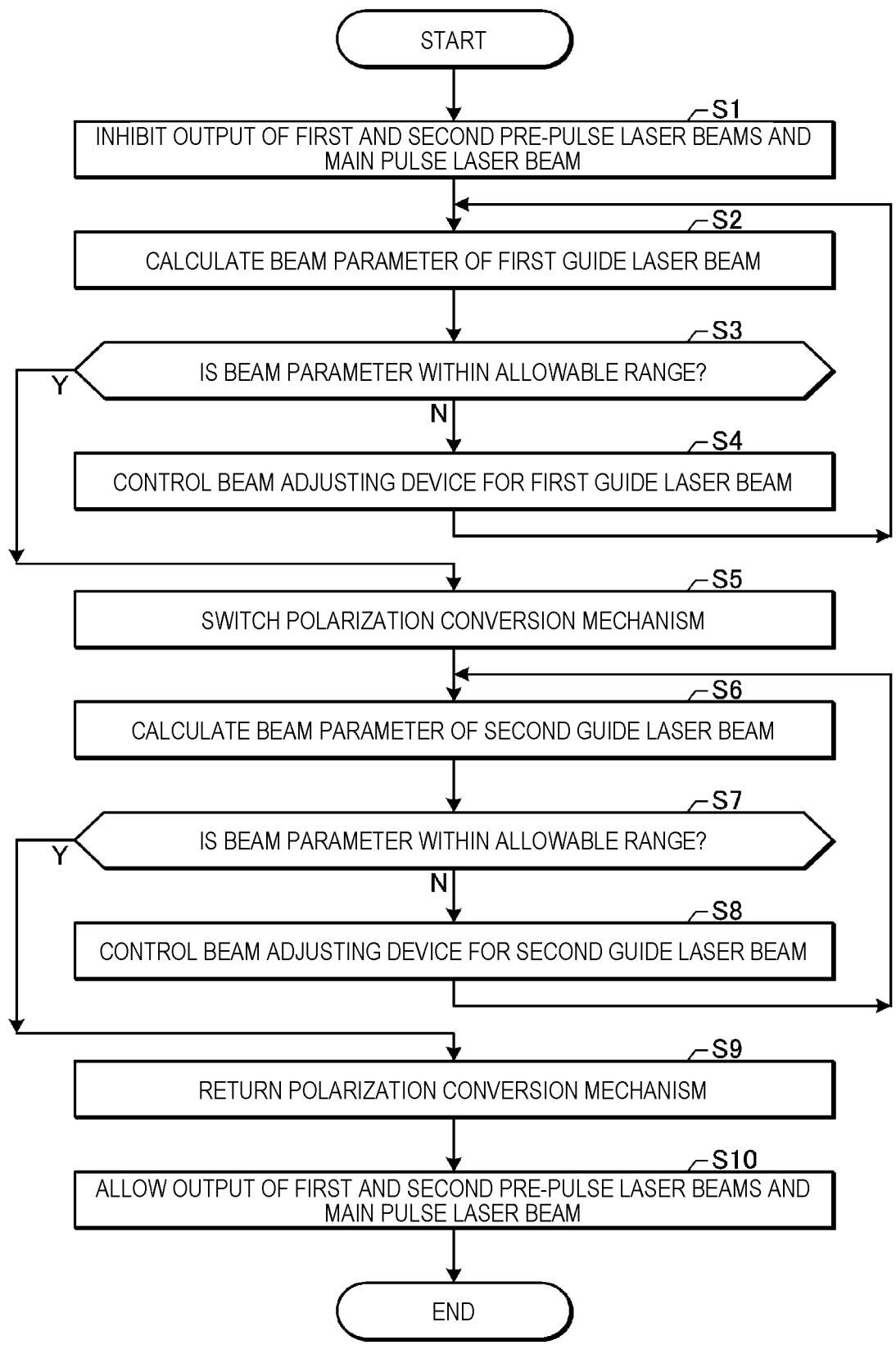
FIG. 7 is a flowchart of a beam adjusting operation for the first pre-pulse laser beam P1 and the second pre-pulse laser beam P2 in the first embodiment.

FIG. 7 is a flowchart of a beam adjusting operation for the first pre-pulse laser beam P1 and the second pre-pulse laser beam P2 in the first embodiment. The EUV light generation control unit 5 controls the beam adjusting devices 51 and 52 based on output from the beam monitor 59 according to processing in FIG. 7.

First, processes in S1 to S4 are similar to those in the comparative example. In the processes in S1 to S4, the polarization conversion mechanism 41 is in the first state. In the first state, the polarization conversion mechanism 41 emits the first guide laser beam G1 having the first polarization component. Thus, the beam monitor 59 detects the first guide laser beam G1 having passed through the beam adjusting device 51, and the EUV light generation control unit 5 controls the beam adjusting device 51 based on the data output from the beam monitor 59. The processes in S1 to S4 correspond to a first step in the present disclosure.

In S3, if it is determined that a beam parameter of the first guide laser beam G1 is within an allowable range (YES in S3), the EUV light generation control unit 5 goes to a process in S5. In S5, the EUV light generation control unit 5 switches the polarization conversion mechanism 41 from the first state to the second state. Thus, the polarization conversion mechanism 41 emits the second guide laser beam G2 rather than the first guide laser beam G1. The beam monitor 59 detects the second guide laser beam G2 having passed through the beam adjusting device 52.

Then, in S6, the EUV light generation control unit 5 receives data output from the beam monitor 59. The EUV light generation control unit 5 calculates a beam parameter of the second guide laser beam G2 based on the received data.

Then, in S7, the EUV light generation control unit 5 determines whether or not the calculated beam parameter of the second guide laser beam G2 is within an allowable range. For example, if the beam parameter of the second guide laser beam G2 represents a value out of the allowable range, the EUV light generation control unit 5 determines that a detection result is not within the allowable range. The beam parameter of the second guide laser beam G2 may represent a value out of the allowable range due to, for example, deformation of the high reflection mirrors 44, 45, 46 or the like or misalignment of the second pre-pulse laser apparatus 3b.

In S7, if it is determined that the beam parameter of the second guide laser beam G2 is not within the allowable range (NO in S7), the EUV light generation control unit 5 goes to a process in S8. In S8, the EUV light generation control unit 5 controls the beam adjusting device 52 so that the beam parameter of the second guide laser beam G2 is within the allowable range. After S8, the EUV light generation control unit 5 returns to the process in S6, again receives the data output from the beam monitor 59, and again calculates the beam parameter of the second guide laser beam G2. The processes in S5 to S8 correspond to a second step in the present disclosure.

In S7, if it is determined that the beam parameter of the second guide laser beam G2 is within the allowable range (YES in S7), the EUV light generation control unit 5 goes to a process in S9. In S9, the EUV light generation control unit 5 returns the polarization conversion mechanism 41 from the second state to the first state. Thus, the polarization conversion mechanism 41 emits the first guide laser beam G1 rather than the second guide laser beam G2.

The next process in S10 is similar to that in the comparative example. After S10, the EUV light generation control unit 5 finishes the processing in this flowchart. The processes in S9 and S10 and a subsequent process of causing the laser system 3 to output the first and second pre-pulse laser beams P1, P2 and the main pulse laser beam M correspond to a third step in the present disclosure.

In the third step, the EUV light generation control unit 5 may cause the laser system 3 to output the first and second pre-pulse laser beams P1, P2 and the main pulse laser beam M, and further output the first guide laser beam G1. The EUV light generation control unit 5 may control the beam adjusting device 51 based on the data on the first guide laser beam G1 by the beam monitor 59 even during output of the first and second pre-pulse laser beams P1, P2 and the main pulse laser beam M.

In the third step, the EUV light generation control unit 5 may further switch the polarization conversion mechanism 41. The EUV light generation control unit 5 may control the beam adjusting device 52 based on the data on the second guide laser beam G2 by the beam monitor 59 even during the output of the first and second pre-pulse laser beams P1, P2 and the main pulse laser beam M. In this case, the beam monitor 59 does not need to detect the first and second pre-pulse laser beams P1, P2 and the main pulse laser beam M. Thus, the beam monitor 59 may be adapted for the second wavelength of the first and second guide laser beams G1, G2.

3.4 Effect

According to the above configuration and operation, before the output of the first pre-pulse laser beam P1, the second pre-pulse laser beam P2, and the main pulse laser beam M, the beam adjusting devices 51 and 52 are controlled based on the detection results of the first and second guide laser beams G1, G2. Thus, the first pre-pulse laser beam P1 and the second pre-pulse laser beam P2 can be applied to the target with high accuracy from the start of the output of the first pre-pulse laser beam P1 and the second pre-pulse laser beam P2.

Also, according to the above configuration and operation, the polarization conversion mechanism 41 and the polarization beam splitter 55 can split the guide laser beam G into the optical path of the first guide laser beam G1 and the optical path of the second guide laser beam G2. This allows the guide laser apparatus 3g to be shared by the first pre-pulse laser beam P1 and the second pre-pulse laser beam P2. Also, even if the first pre-pulse laser beam P1 and the second pre-pulse laser beam P2 are transmitted through a common transmission path, the pre-pulse laser beams can be separately adjusted.

In the configuration in FIGS. 5 and 6, the polarization beam splitter 55 reflects the first pre-pulse laser beam P1 and the first guide laser beam G1 having the first polarization component, and transmits the second pre-pulse laser beam P2 and the second guide laser beam G2 having the second polarization component. Specifically, in the configuration in FIGS. 5 and 6, the beam adjusting device 51 adjusts the beam parameters of the first pre-pulse laser beam P1 and the first guide laser beam G1. In the configuration in FIGS. 5 and 6, the beam adjusting device 52 adjusts the beam parameters of the second pre-pulse laser beam P2 and the second guide laser beam G2.

However, even a configuration different from that in FIGS. 5 and 6 can perform the processing described in the flowchart in FIG. 7. Specifically, the polarization beam splitter 55 may transmit the first pre-pulse laser beam P1 and the first guide laser beam G1 having the first polarization component, and reflect the second pre-pulse laser beam P2 and the second guide laser beam G2 having the second polarization component. In this case, unlike the configuration in FIGS. 5 and 6, the beam adjusting device 52 adjusts the beam parameters of the first pre-pulse laser beam P1 and the first guide laser beam G1. The beam adjusting device 51 adjusts the beam parameters of the second pre-pulse laser beam P2 and the second guide laser beam G2.

Thus, the beam adjusting device 51 or 52 configured to adjust the beam parameters of the first pre-pulse laser beam P1 and the first guide laser beam G1 is sometimes referred to as a third beam adjusting device in the present disclosure. On the other hand, the beam adjusting device 52 or 51 configured to adjust the beam parameters of the second pre-pulse laser beam P2 and the second guide laser beam G2 is sometimes referred to as a fourth beam adjusting device in the present disclosure. When the beam adjusting device 51 is the third beam adjusting device, the beam adjusting device 52 is the fourth beam adjusting device. When the beam adjusting device 52 is the third beam adjusting device, the beam adjusting device 51 is the fourth beam adjusting device.

4. Example of Beam Adjusting Device

In the above embodiment, the beam adjusting devices 51 and 52 can have substantially the same configurations. An example of a beam adjusting device usable as any of the beam adjusting devices 51 and 52 will be described below.

4.1 Beam Position and Beam Pointing Adjuster

Figure 8A:
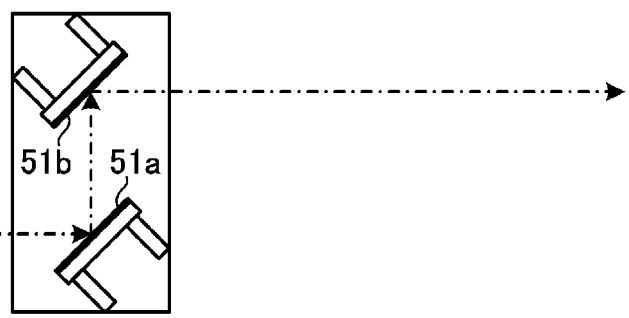
FIG. 8A shows a first example of a beam adjusting device usable in the embodiment.

FIG. 8A shows a first example of a beam adjusting device usable in the embodiment. A beam adjusting device 511 includes two high reflection mirrors 51a, 51b. Orientations of the high reflection mirrors 51a, 51b can be changed by actuators.

Figure 8B:
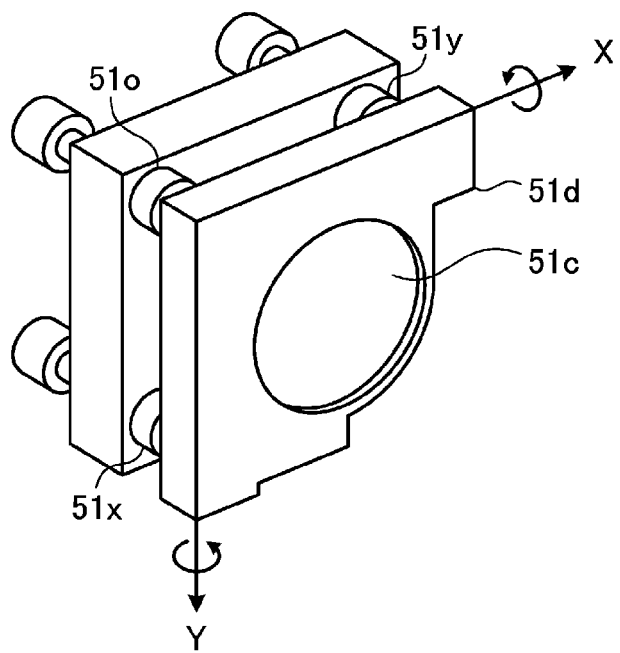
FIG. 8B shows a configuration of a high reflection mirror 51a included in the first example.

FIG. 8B shows a configuration of the high reflection mirror 51a included in the beam adjusting device 511. The high reflection mirror 51a includes a reflector 51c, a holder 51d, a fulcrum 51o, and a plurality of actuators 51x, 51y. The reflector 51c is held by the holder 51d. The holder 51d is supported at three points by the fulcrum 51o and the actuators 51x, 51y.

The actuator 51x expands and contracts according to an external electrical signal to adjust rotation angles of the reflector 51c and the holder 51d around an X axis. The actuator 51y expands and contracts according to an external electrical signal to adjust rotation angles of the reflector 51c and the holder 51d around a Y axis. The electrical signals are supplied to the actuators 51x, 51y from the EUV light generation control unit 5 or a driver (not shown) controlled by the EUV light generation control unit 5.

The high reflection mirror 51b has a configuration similar to that of the high reflection mirror 51a. A combination of two or more of such high reflection mirrors constitute the beam adjusting device 511 configured to be able to adjust a beam position and a beam pointing of the first pre-pulse laser beam P1 or the second pre-pulse laser beam P2. Two beam adjusting devices 511 are prepared, and thus one can be used as the beam adjusting device 51 and the other can be used as the beam adjusting device 52.

In FIGS. 5 and 6, the high reflection mirror 53 is provided between the polarization beam splitter 55 and the beam adjusting device 51, and the high reflection mirror 54 is provided between the beam adjusting device 51 and the polarization beam splitter 56, but the present disclosure is not limited to this. The high reflection mirror 51a in FIG. 8A may be dispensed with if an actuator (not shown) can change an orientation of the high reflection mirror 53 in FIGS. 5 and 6. The high reflection mirror 51b in FIG. 8A may be dispensed with if an actuator (not shown) can change an orientation of the high reflection mirror 54 in FIGS. 5 and 6. Specifically, instead of the beam adjusting device 51 in FIGS. 5 and 6, the high reflection mirrors 53 and 54 with the actuators can function as the beam adjusting device.

4.2 Beam Diameter and Beam Divergence Adjuster

Figure 9A:
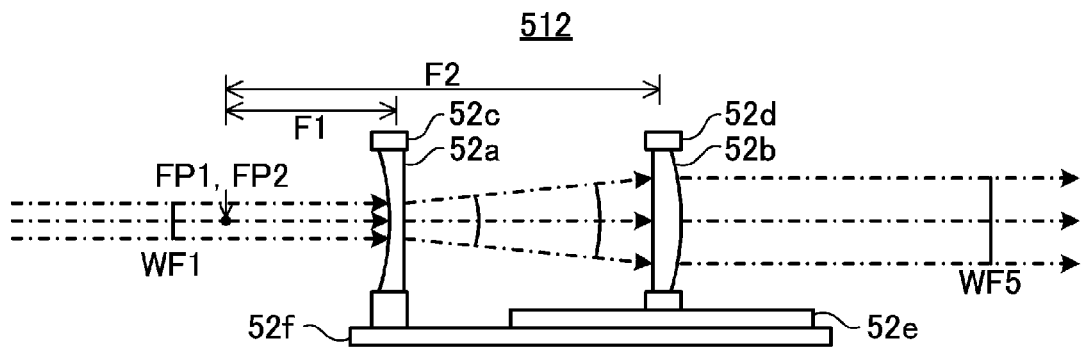
FIGS. 9A to 9C show a second example of a beam adjusting device usable in the embodiment.
Figure 9B:
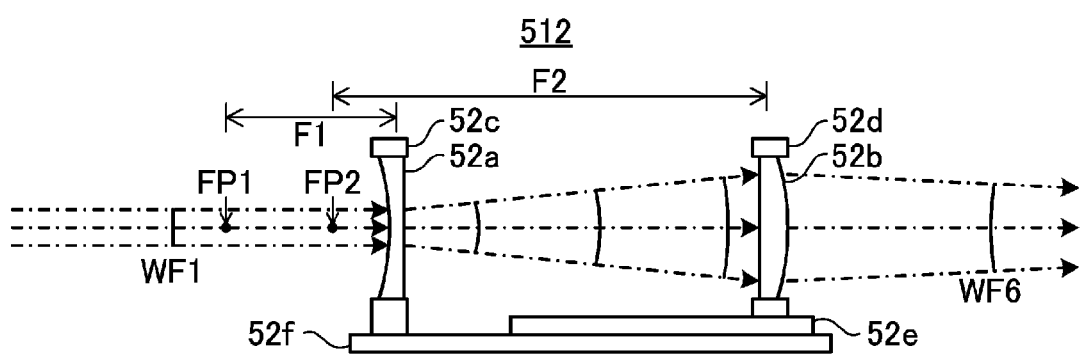
Figure 9C:
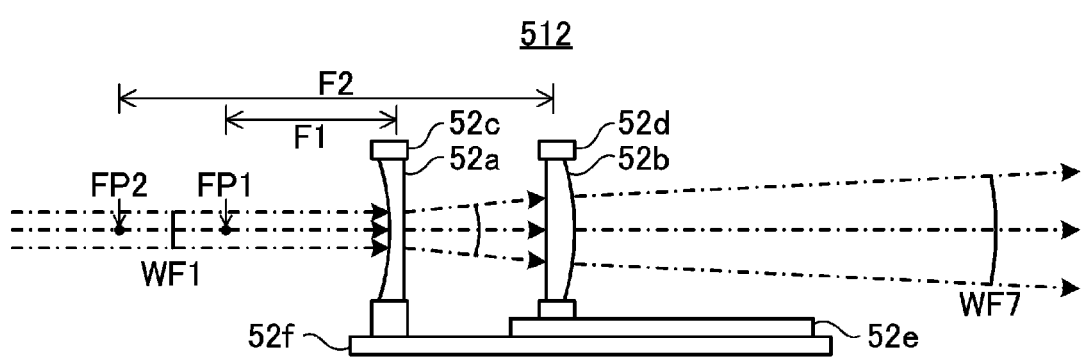

FIGS. 9A to 9C show a second example of a beam adjusting device usable in the embodiment. A beam adjusting device 512 includes a concave lens 52a and a convex lens 52b.

The concave lens 52a is secured by a holder 52c. The holder 52c is secured to a securing plate 52f.

The convex lens 52b is held by a holder 52d. The holder 52d is supported via a linear stage 52e by the securing plate 52f. The linear stage 52e supports the holder 52d so that the convex lens 52b held by the holder 52d can reciprocate along an optical path axis of a laser beam relative to the securing plate 52f.

The concave lens 52a has a front focal point FP1 at a focal length F1 away on an upstream side of the optical path of the laser beam. The convex lens 52b has a front focal point FP2 at a focal length F2 away on the upstream side of the optical path of the laser beam.

FIGS. 9A to 9C show a laser beam having a substantially planar wavefront WF1 entering the concave lens 52a. In FIG. 9A, the front focal point FP1 of the concave lens 52a substantially matches the front focal point FP2 of the convex lens 52b. In this state, if the laser beam having the substantially planar wavefront WF1 enters the concave lens 52a, the laser beam emitted from the convex lens 52b also has a substantially planar wavefront WF5.

In FIG. 9B, the front focal point FP2 of the convex lens 52b is located on a downstream side from the front focal point FP1 of the concave lens 52a in the traveling direction of the laser beam. In the case in FIG. 9B, the laser beam emitted from the convex lens 52b has a concave wavefront WF6 toward the traveling direction of the laser beam.

In FIG. 9C, the front focal point FP2 of the convex lens 52b is located on the upstream side from the front focal point FP1 of the concave lens 52a in the traveling direction of the laser beam. In the case in FIG. 9C, the laser beam emitted from the convex lens 52b has a convex wavefront WF7 toward the traveling direction of the laser beam.

The linear stage 52e is driven to adjust a positional relationship between the front focal point FP1 of the concave lens 52a and the front focal point FP2 of the convex lens 52b. The linear stage 52e is driven by the EUV light generation control unit 5 or a driver (not shown) controlled by the EUV light generation control unit 5.

With the above configuration, the beam adjusting device 512 can adjust a beam divergence of the laser beam.

A beam diameter of the laser beam emitted from the convex lens 52b decreases in FIG. 9B and increases in FIG. 9C as the laser beam is farther from the convex lens 52b. Thus, two or more beam adjusting devices 512 can be combined so that, on the downstream side of one beam adjusting device 512, another beam adjusting device 512 is arranged, thereby allowing the beam diameter and the beam divergence to be independently adjusted.

5. Example of Beam Monitor

Figure 10:
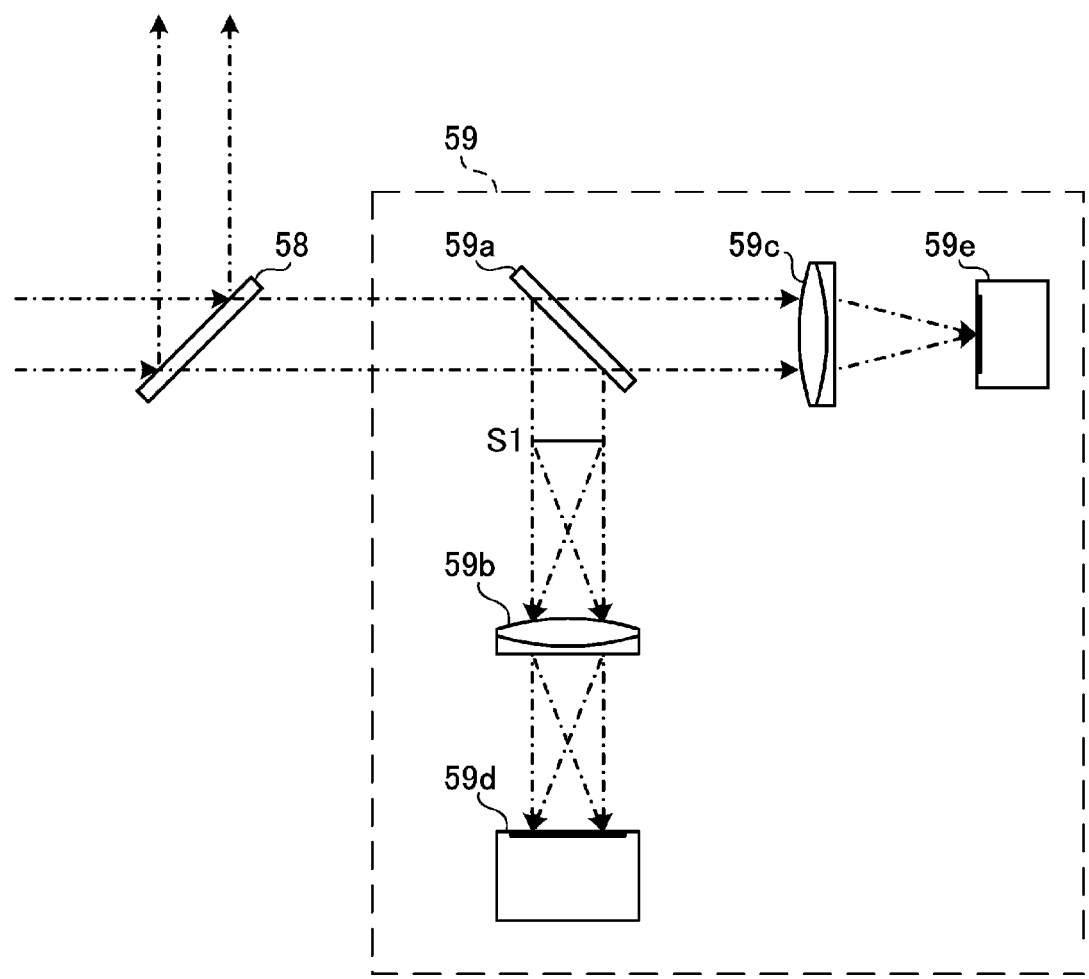
FIG. 10 shows an example of a beam monitor usable in the embodiment.

FIG. 10 shows a beam monitor usable in the embodiment. The beam monitor 59 includes a beam splitter 59a, a transfer optical system 59b, a collecting optical system 59c, and two-dimensional photosensors 59d, 59e.

The beam splitter 59a is configured to transmit part of the laser beam having entered the beam monitor 59 and to reflect other part of the laser beam. Thus, the beam splitter 59a splits the optical path of the laser beam into two optical paths.

The transfer optical system 59b and the collecting optical system 59c are constituted by, for example, achromatic lenses with reduced chromatic aberration between the first wavelength of the first and second pre-pulse laser beams P1, P2 and the second wavelength of the first and second guide laser beams G1, G2.

The transfer optical system 59b is arranged in one of the two optical paths of the laser beam split by the beam splitter 59a. The transfer optical system 59b forms, on a light receiving surface of the two-dimensional photosensor 59d, an image of a section S1 of the optical path of the laser beam.

The collecting optical system 59c is arranged in the other of the two optical paths of the laser beam split by the beam splitter 59a. The collecting optical system 59c focuses the laser beam on the light receiving surface of the two-dimensional photosensor 59e.

The two-dimensional photosensors 59d, 59e are constituted by image sensors sensitive to both the first wavelength and the second wavelength.

The two-dimensional photosensor 59d generates image data on the section of the optical path of the laser beam received via the transfer optical system 59b, and transmits the image data to the EUV light generation control unit 5. The EUV light generation control unit 5 can calculate a beam position of the laser beam based on the image data generated by the two-dimensional photosensor 59d. Alternatively, the EUV light generation control unit 5 can calculate a beam diameter D of the laser beam based on the image data generated by the two-dimensional photosensor 59d.

The two-dimensional photosensor 59e generates image data on a focusing point of the laser beam received via the collecting optical system 59c, and transmits the image data to the EUV light generation control unit 5. The EUV light generation control unit 5 can calculate a beam pointing of the laser beam based on the image data generated by the two-dimensional photosensor 59e. The beam pointing of the laser beam is calculated based on a positional relationship between a reference position of the light receiving surface of the two-dimensional photosensor 59e and a focusing position of the laser beam. Alternatively, the EUV light generation control unit 5 can calculate an absolute value of a beam divergence θ of the laser beam based on the image data generated by the two-dimensional photosensor 59e. The absolute value of the beam divergence θ of the laser beam can be calculated using a spot diameter Sp of the focused laser beam and a focal length F of the collecting optical system 59c by the following expression:

$$\theta = Sp/F$$

A curvature X of a wavefront of the laser beam at the section S1 can be calculated by the following expression:

$$X = 2 \sin \theta / D$$

6. Supplementation

The above descriptions are intended to be illustrative only and not restrictive. Thus, it will be apparent to those skilled in the art that modifications may be made in the embodiments of the present disclosure without departing from the scope of the appended claims.

The terms used throughout the specification and the appended claims should be interpreted as "non-limiting". For example, the term "comprising" or "comprised" should be interpreted as "not limited to what has been described as being comprised". The term "having" should be interpreted as "not limited to what has been described as having". Further, the modifier "a/an" described in the specification and the appended claims should be interpreted to mean "at least one" or "one or more".

What is claimed is:

1. A laser system comprising:
 a pulse laser system configured to emit, along a first optical path, a first laser beam having a first wavelength component and having a first polarization component and a second laser beam having the first wavelength component and having a second polarization component different from the first polarization component;
 a guide laser apparatus configured to emit, along a second optical path, a third laser beam having a second wavelength component different from the first wavelength component;
 a polarization conversion mechanism located in the second optical path, and configured to be able to switch between a first state in which the third laser beam is allowed to travel as a first guide laser beam having the first polarization component along a third optical path, and a second state in which the third laser beam is allowed to travel as a second guide laser beam having the second polarization component along the third optical path;
 a dichroic mirror having a first surface located in the first optical path and a second surface located in the third optical path, and configured to reflect the first and second laser beams having the first wavelength component or the first and second guide laser beams having the second wavelength component, to transmit the first and second laser beams or the first and second guide laser beams that are not reflected by the dichroic mirror, and to allow the first and second laser beams and the first and second guide laser beams to travel along a fourth optical path; and
 a polarization beam splitter located in the fourth optical path, and configured to reflect the first laser beam having the first wavelength component and having the first polarization component and the first guide laser beam having the second wavelength component and having the first polarization component, and to transmit the second laser beam having the first wavelength component and having the second polarization component and the second guide laser beam having the second wavelength component and having the second polarization component.

2. The laser system according to claim 1, wherein
 the pulse laser system includes a first laser apparatus configured to output the first laser beam, and a second laser apparatus configured to output the second laser beam.

3. The laser system according to claim 2, wherein
 the pulse laser system further includes a second polarization beam splitter configured to reflect one of the first laser beam having the first polarization component and the second laser beam having the second polarization component, to transmit the other, and to allow the first and second laser beams to travel along the first optical path.

4. The laser system according to claim 3, wherein
 the first laser apparatus includes a first oscillator configured to output a laser beam, and a first wave plate configured to convert the laser beam output from the first oscillator into the first laser beam having the first polarization component.

5. The laser system according to claim 3, wherein
 the second laser apparatus includes a second oscillator configured to output a laser beam, and a second wave plate configured to convert the laser beam output from the second oscillator into the second laser beam having the second polarization component.

6. The laser system according to claim 3, wherein
 the pulse laser system further includes a third wave plate arranged in the first optical path.

7. The laser system according to claim 1, wherein
 the guide laser apparatus is configured to output the third laser beam linear-polarized, and
 the polarization conversion mechanism includes a half-wave plate located in an optical path of the third laser beam, and a rotation mechanism configured to rotate the half-wave plate.

8. The laser system according to claim 7, further comprising
 a controller configured to control the rotation mechanism.

9. The laser system according to claim 1, wherein
 the dichroic mirror is configured to reflect the first and second laser beams and to transmit the first and second guide laser beams.

10. The laser system according to claim 1, further comprising:
- a first beam adjusting device arranged in optical paths of the first laser beam and the first guide laser beam reflected by the polarization beam splitter, and configured to allow the first laser beam and the first guide laser beam to travel along a fifth optical path; and
- a second beam adjusting device arranged in optical paths of the second laser beam and the second guide laser beam having passed through the polarization beam splitter, and configured to allow the second laser beam and the second guide laser beam to travel along a sixth optical path.

11. The laser system according to claim 10, further comprising
- a third polarization beam splitter including a third surface located in the fifth optical path and a fourth surface located in the sixth optical path, and configured to reflect the first laser beam and the first guide laser beam having the first polarization component or the second laser beam and the second guide laser beam having the second polarization component, to transmit the first laser beam and the first guide laser beam or the second laser beam and the second guide laser beam that are not reflected by the third polarization beam splitter, and to allow the first and second laser beams and the first and second guide laser beams to travel along a seventh optical path.

12. The laser system according to claim 11, further comprising:
- a beam monitor located in the seventh optical path, and configured to detect the first and second guide laser beams and to output data; and
- a controller configured to control the first and second beam adjusting devices based on the data output from the beam monitor.

13. The laser system according to claim 10, further comprising:
- a beam monitor configured to detect the first guide laser beam traveling from the first beam adjusting device and to output data; and
- a controller configured to control the first beam adjusting device based on the data output from the beam monitor.

14. The laser system according to claim 10, further comprising:
- a beam monitor configured to detect the second guide laser beam traveling from the second beam adjusting device and to output data; and
- a controller configured to control the second beam adjusting device based on the data output from the beam monitor.

15. An extreme ultraviolet light generation apparatus comprising:
- a laser system including
  - a pulse laser system configured to emit, along a first optical path, a first laser beam having a first wavelength component and having a first polarization component and a second laser beam having the first wavelength component and having a second polarization component different from the first polarization component,
  - a guide laser apparatus configured to emit, along a second optical path, a third laser beam having a second wavelength component different from the first wavelength component,
  - a polarization conversion mechanism located in the second optical path, and configured to be able to switch between a first state in which the third laser beam is allowed to travel as a first guide laser beam having the first polarization component along a third optical path, and a second state in which the third laser beam is allowed to travel as a second guide laser beam having the second polarization component along the third optical path,
  - a dichroic mirror having a first surface located in the first optical path and a second surface located in the third optical path, and configured to reflect the first and second laser beams having the first wavelength component or the first and second guide laser beams having the second wavelength component, to transmit the first and second laser beams or the first and second guide laser beams that are not reflected by the dichroic mirror, and to allow the first and second laser beams and the first and second guide laser beams to travel along a fourth optical path, and
  - a polarization beam splitter located in the fourth optical path, and configured to reflect the first laser beam having the first wavelength component and having the first polarization component and the first guide laser beam having the second wavelength component and having the first polarization component, and to transmit the second laser beam having the first wavelength component and having the second polarization component and the second guide laser beam having the second wavelength component and having the second polarization component;
- a chamber;
- a target supply unit configured to supply a target to a predetermined region in the chamber; and
- a laser beam collecting optical system configured to focus the first and second laser beams emitted from the laser system on the predetermined region.

16. An extreme ultraviolet light generation method using an extreme ultraviolet light generation apparatus including
- a laser system including
  - a pulse laser system configured to emit, along a first optical path, a first laser beam having a first wavelength component and having a first polarization component and a second laser beam having the first wavelength component and having a second polarization component different from the first polarization component,
  - a guide laser apparatus configured to emit, along a second optical path, a third laser beam having a second wavelength component different from the first wavelength component,
  - a polarization conversion mechanism located in the second optical path, and configured to be able to switch between a first state in which the third laser beam is allowed to travel as a first guide laser beam having the first polarization component along a third optical path, and a second state in which the third laser beam is allowed to travel as a second guide laser beam having the second polarization component along the third optical path,
  - a dichroic mirror having a first surface located in the first optical path and a second surface located in the third optical path, and configured to reflect the first and second laser beams having the first wavelength component or the first and second guide laser beams having the second wavelength component, to transmit the first and second laser beams or the first and second guide laser beams that are not reflected by the dichroic mirror, and to allow the first and second laser beams and the first and second guide laser beams to travel along a fourth optical path, and a polarization beam splitter located in the fourth optical path, and configured to reflect the first laser beam and the first guide laser beam having the first polarization component or the second laser beam and the second guide laser beam having the second polarization component, and to transmit the first laser beam and the first guide laser beam or the second laser beam and the second guide laser beam that are not reflected by the polarization beam splitter, a chamber, a target supply unit configured to supply a target to a predetermined region in the chamber, and a laser beam collecting optical system configured to focus the first and second laser beams emitted from the laser system on the predetermined region, the method comprising:
- a first step of detecting the first guide laser beam traveling from the polarization beam splitter when the polarization conversion mechanism is in the first state; and
- a second step of, after the first step, switching the polarization conversion mechanism to the second state and detecting the second guide laser beam traveling from the polarization beam splitter.

17. The extreme ultraviolet light generation method according to claim 16, wherein
   the laser system further includes a third beam adjusting device arranged in optical paths of the first laser beam and the first guide laser beam traveling from the polarization beam splitter, and a fourth beam adjusting device arranged in optical paths of the second laser beam and the second guide laser beam traveling from the polarization beam splitter,
   the first step further includes controlling the third beam adjusting device when a detection result of the first guide laser beam is out of an allowable range, and
   the second step further includes controlling the fourth beam adjusting device when a detection result of the second guide laser beam is out of an allowable range.

18. The extreme ultraviolet light generation method according to claim 16, further comprising,
   after the second step, a third step of emitting the first and second laser beams from the pulse laser system, wherein
   the first and second steps are performed with emission of the first and second laser beams from the pulse laser system being stopped.

* * * * *